US009785002B2

(12) United States Patent
Bae et al.

(10) Patent No.: US 9,785,002 B2
(45) Date of Patent: Oct. 10, 2017

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Kwang Soo Bae, Yongin-si (KR); Yu Jin Kim, Hwaseong-si (KR); Sang Il Kim, Yongin-si (KR); Kyung Tae Chae, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 64 days.

(21) Appl. No.: 14/831,532

(22) Filed: Aug. 20, 2015

(65) Prior Publication Data

US 2016/0124260 A1    May 5, 2016

(30) Foreign Application Priority Data

Oct. 30, 2014 (KR) .................. 10-2014-0149352

(51) Int. Cl.
  *G02F 1/1333* (2006.01)
  *G02F 1/1368* (2006.01)
  *H01L 27/12* (2006.01)

(52) U.S. Cl.
  CPC ...... *G02F 1/133377* (2013.01); *G02F 1/1368* (2013.01); *G02F 1/133371* (2013.01); *H01L 27/1214* (2013.01); *H01L 27/1259* (2013.01)

(58) Field of Classification Search
  CPC ............. G02F 1/133377; G02F 1/133371
  See application file for complete search history.

(56) References Cited

U.S. PATENT DOCUMENTS

| 2011/0222016 A1* | 9/2011 | Kaneko | G02F 1/13394 349/155 |
| 2012/0206666 A1* | 8/2012 | Jeong | G02F 1/292 349/15 |
| 2014/0125910 A1* | 5/2014 | Kim | G02F 1/133377 349/46 |
| 2014/0146278 A1* | 5/2014 | Lee | G02F 1/133512 349/110 |

(Continued)

FOREIGN PATENT DOCUMENTS

| KR | 10-2007-0024945 A | 3/2007 |
| KR | 10-2007-0030378 A | 3/2007 |

(Continued)

OTHER PUBLICATIONS

European Search Report for European Patent Application No. EP 15191863.8, European Patent Office, Mar. 31, 2016, 10 pages, Munich, Germany.

*Primary Examiner* — Sang V Nguyen
(74) *Attorney, Agent, or Firm* — Innovation Counsel LLP

(57) ABSTRACT

A curved liquid crystal display and a method of manufacturing it are presented. The display includes: a substrate having a central portion; a thin film transistor disposed on the substrate; a pixel electrode connected to the thin film transistor; and a roof layer disposed to face the pixel electrode; and a liquid crystal layer disposed between the pixel electrode and the roof layer and formed by a plurality of microcavities, wherein the microcavities hold a liquid crystal material, wherein a difference between a maximum cell gap and a minimum cell gap in each of the microcavities increases with distance from the central portion of the substrate.

20 Claims, 27 Drawing Sheets

(56) References Cited

U.S. PATENT DOCUMENTS

| | | | |
|---|---|---|---|
| 2014/0160395 A1* | 6/2014 | Park | G02B 27/2214 349/61 |
| 2014/0176893 A1* | 6/2014 | Sugitani | G02F 1/133305 349/143 |
| 2014/0268000 A1* | 9/2014 | Lim | G02F 1/1339 349/153 |
| 2015/0109566 A1 | 4/2015 | Yun et al. | |
| 2015/0116619 A1* | 4/2015 | Yi | G02B 27/2214 349/43 |
| 2015/0192809 A1* | 7/2015 | Kim | G02F 1/133371 349/160 |
| 2015/0212365 A1 | 7/2015 | Beon et al. | |
| 2016/0231607 A1* | 8/2016 | Wu | G02F 1/1339 |

FOREIGN PATENT DOCUMENTS

| | | |
|---|---|---|
| KR | 10-2013-0031970 A | 4/2013 |
| KR | 10-2014-0002491 A | 1/2014 |
| KR | 10-2014-0025220 A | 3/2014 |
| KR | 10-2014-0058773 A | 5/2014 |
| KR | 10-2014-0070750 A | 6/2014 |
| KR | 1020140090851 | 7/2014 |

* cited by examiner

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2014-0149352 filed in the Korean Intellectual Property Office on Oct. 30, 2014, the entire contents of which are incorporated herein by reference.

BACKGROUND (a) Field

The present invention relates to a liquid crystal display and a manufacturing method thereof.

(b) Description of the Related Art

Liquid crystal displays are flat panel display devices that are widely used today. Typically, a liquid crystal display includes two display panels—for example field generating electrodes such as a pixel electrode and a common electrode—with a liquid crystal layer interposed therebetween.

A liquid crystal display generates an electric field in a liquid crystal layer by applying a voltage to the field generating electrodes to control orientations of liquid crystal molecules in the liquid crystal layer, thereby and polarizing incident light in the desired manner to display an image.

A technique of forming a cavity in a pixel and filling the cavity with liquid crystals to implement a display has been developed. Unlike a conventional liquid crystal display that uses two sheets of substrates, this cavity-technique forms constituent elements on one substrate, thereby reducing weight, thickness, and the like of the device.

This cavity-type display device may be applied to a curved panel that has a curvature. When this panel is bent to have a predetermined curvature, a light visibility difference is generated at a central portion and a peripheral portion.

The above information disclosed in this Background section is only for enhancement of understanding of the background of the invention and therefore it may contain information that does not form the prior art that is already known in this country to a person of ordinary skill in the art.

SUMMARY

The present inventive concept has been made in an effort to provide a liquid crystal display, and a manufacturing method thereof, having advantages of a cell gap that is gradually changed from a central portion to a peripheral portion of a panel.

An exemplary embodiment provides a liquid crystal display including: a substrate having a central portion; a thin film transistor disposed on the substrate; a pixel electrode connected to the thin film transistor; and a roof layer disposed to face the pixel electrode; and a liquid crystal layer disposed between the pixel electrode and the roof layer and formed by a plurality of microcavities, wherein the microcavities hold a liquid crystal material, wherein a difference between a maximum cell gap and a minimum cell gap in each of the microcavities increases with distance from the central portion of the substrate.

A pretilt angle of the liquid crystal material disposed at an upper portion of one of the microcavities may be different from that of the liquid crystal material disposed at a lower portion of the same one of the microcavities.

A pretilt angle difference between the liquid crystal materials disposed at the upper portion and the lower portion of the microcavities may increase from the central portion to the peripheral portion.

The roof layer may have a curved bottom surface that interfaces the microcavities and a flat top surface that is parallel with the substrate.

When the substrate is bent, the bottom surface of the roof layer may be parallel with the substrate and the top surface may have a curvature.

At a microcavity in the peripheral portion, the liquid crystal material that is adjacent to the substrate may be substantially vertically aligned to the substrate and the liquid crystal material that is adjacent to the roof layer may have a tilt angle.

When the substrate is bent, the liquid crystal material that is adjacent to the roof layer may be substantially vertically aligned and the liquid crystal material that is adjacent to the substrate may have a tilt angle in the microcavities disposed at the peripheral portion.

A difference between a maximum thickness and a minimum thickness of the roof layer increases with distance from the central portion of the substrate.

When the substrate is bent, a thickness of the roof layer may be constant across the substrate.

A forward direction from the central portion to the peripheral portion may be substantially parallel with long sides of the substrate.

Cell gaps of the microcavities disposed in the central portion of the substrate may be substantially constant.

A tilt angle of the liquid crystal material that is adjacent to the roof layer at the microcavities may increase with distance from the central portion of the substrate.

An exemplary embodiment of the present invention provides a manufacturing method of a liquid crystal display, including: forming a thin film transistor on a substrate; forming a pixel electrode to be connected to the thin film transistor; forming sacrificial layer patterns on the pixel electrode; forming a roof layer on the sacrificial layer patterns; forming a plurality of microcavities by removing the sacrificial layer patterns; forming a liquid crystal layer by injecting a liquid crystal material into the microcavities; and forming a capping layer on the roof layer, wherein, in the forming of the sacrificial layer, a difference between a maximum height and a minimum height of each of a plurality of sacrificial layer patterns increases with distance from a central portion of the substrate.

A slit mask may be used to form the sacrificial layer patterns.

The roof layer may have a curved bottom surface that interfaces the microcavities and a flat top surface that is parallel with the substrate.

The manufacturing method may further include bending the substrate such that the bottom surface of the roof layer may be parallel with the substrate while the top surface may have a curvature.

A difference between a maximum thickness and a minimum thickness of the roof layer increases with distance from the central portion of the substrate.

The manufacturing method may further include bending the substrate such that a thickness of the roof layer is constant.

A forward direction from the central portion to the peripheral portion may be parallel with long sides of the substrate.

Cell gaps of the microcavities disposed at the central portion of the substrate based on the long sides of the substrate may be substantially constant.

According to the exemplary embodiments of the present invention, it is possible to minimize the degree of retardation that is varied according to position of panel by designing asymmetric cell gaps in pixel units such that a difference of the asymmetric cell gaps is gradually changed, thereby improving the visibility.

DETAILED DESCRIPTION OF THE EMBODIMENTS

Figure 1:
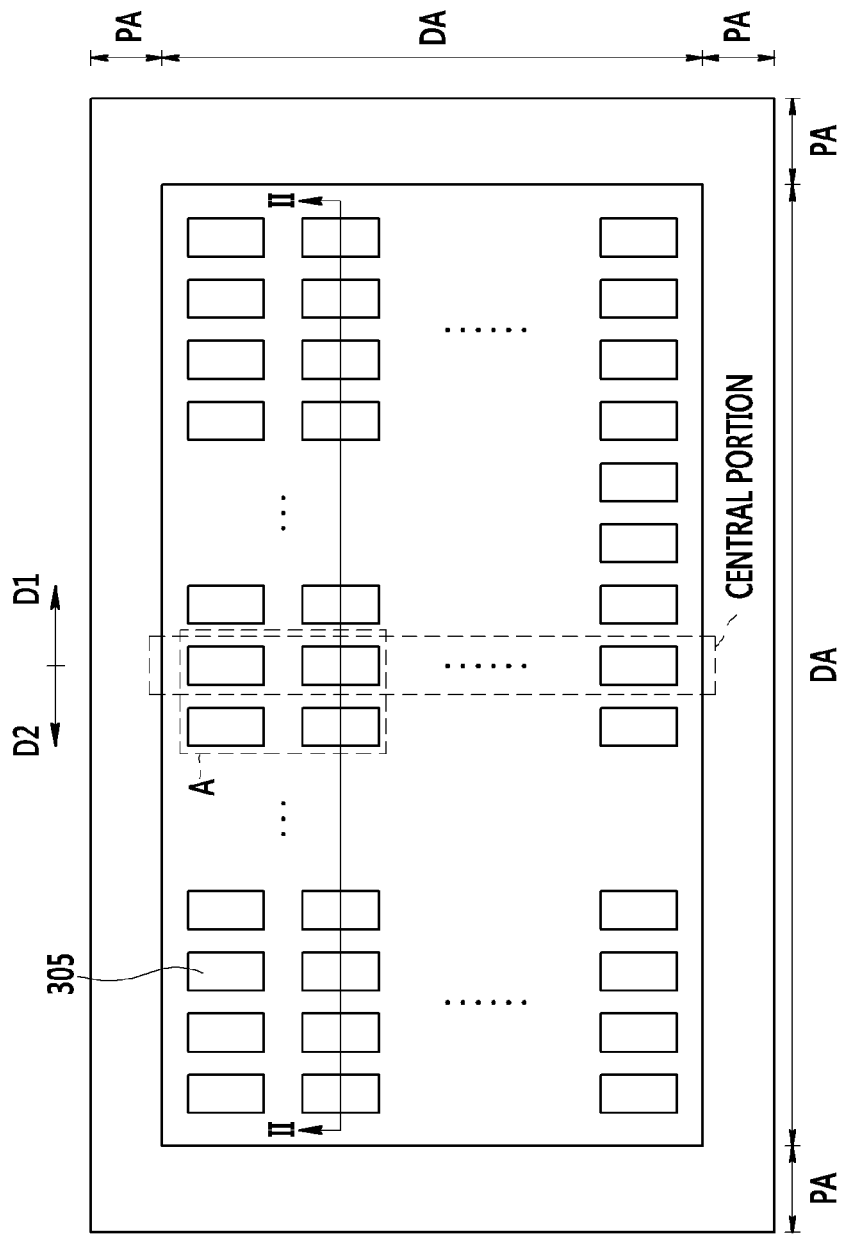
FIG. 1 is a top plan view showing a liquid crystal display according to an exemplary embodiment of the present disclosure.

Hereinafter, exemplary embodiments of the present inventive concept will be described in detail with reference to the accompanying drawings. As those skilled in the art would realize, the described embodiments may be modified in various ways, all without departing from the spirit or scope of the inventive concept. Exemplary embodiments introduced herein are provided to make disclosed contents thorough and complete and to sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening elements may also be present. Like reference numerals designate like elements throughout the specification. A substrate may have a "central portion," which is an area near its center. Where the substrate will be bent to have a curvature along a first direction, the "central portion" includes an area that is at or near the centerline extending perpendicularly to the first direction (see FIG. 1). "Peripheral portion" is intended to include the area outside the central portion including the area near the edges of the substrate.

Figure 2:
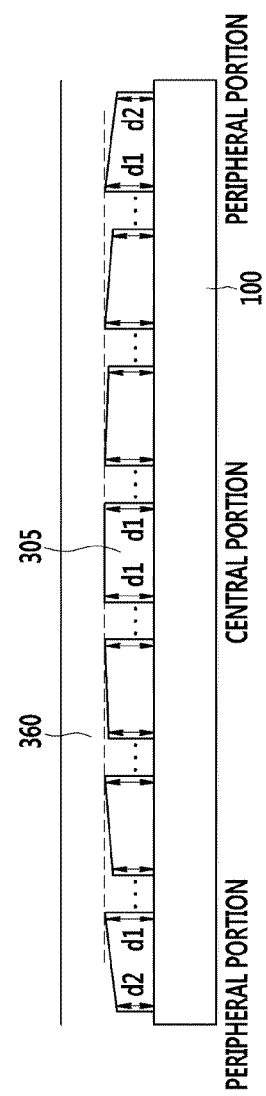
FIG. 2 is a cross-sectional view taken along the line II-II of FIG. 1.

FIG. 1 is a top plan view showing a liquid crystal display according to an exemplary embodiment of the present invention. FIG. 2 is a cross-sectional view taken along the line II-II of FIG. 1.

The liquid crystal display according to the present exemplary embodiment includes a display area DA and a peripheral area PA positioned to surround the display area DA.

The display region DA is a region where an actual image is outputted. The peripheral region PA has a gate driver or a data driver, or a gate pad portion (not shown), a data pad portion (not shown) including a gate pad, a data pad, or the like, which is a portion connected to an external circuit. The gate pad is a wide portion positioned at an end of a gate line, and the data pad is a wide portion positioned at an end of a data line.

A plurality of microcavities 305 are formed in the display area DA of the liquid crystal display according to the present exemplary embodiment. The microcavities 305 serve as spaces for receiving a liquid crystal material, thereby forming a liquid crystal layer. The microcavities 305 may be disposed on a thin film transistor array panel 100 to correspond to the liquid crystal layer. The microcavities 305 are covered with a roof layer 360. The thin film transistor array panel 100 includes a thin film transistor, wires, and the like for driving the liquid crystal display.

As illustrated in FIG. 2, according to the present exemplary embodiment, a difference between the maximum and minimum cell gaps of the microcavities 305 disposed at the peripheral portion of the panel or the thin film transistor array panel 100 is greater than a difference between the maximum and minimum cell gaps of the microcavities 305 disposed at the central portion thereof. Specifically, the cell gap d1 of the microcavities 305 disposed at two opposite ends of the central portion of the thin film transistor array panel 100 is substantially constant. On the other hand, microcavities 305 disposed at the peripheral portion of the thin film transistor array panel 100 each have cell gaps d1 and d2 that are different from each other. The difference between the maximum value and the minimum value of the cell gaps of the microcavities 305 is gradually increased from the central portion to the peripheral portion of the thin film transistor array panel 100, such that there is a gradient of cell gap Δd between the central portion and the peripheral portion. Since the maximum value and the minimum value of the cell gaps of the microcavities 305 disposed at the central portion are substantially the same, the difference between the maximum value and the minimum value of the cell gaps may be in a range of 0 to a difference between a first cell gap d1 and a second cell gap d2.

In the present exemplary embodiment, a horizontal length of the thin film transistor array panel 100 may be larger than a vertical length thereof. A forward direction from the central portion to the peripheral portion of the thin film transistor array panel 100 may be defined as a first direction D1 that is parallel with horizontal long sides thereof, or a second direction D2 that is opposite to the first direction D1. In the direction of the long sides, the cell gaps of the microcavities 305 disposed at the central portion of the thin film transistor array panel 100 may be substantially the same.

Figure 27:
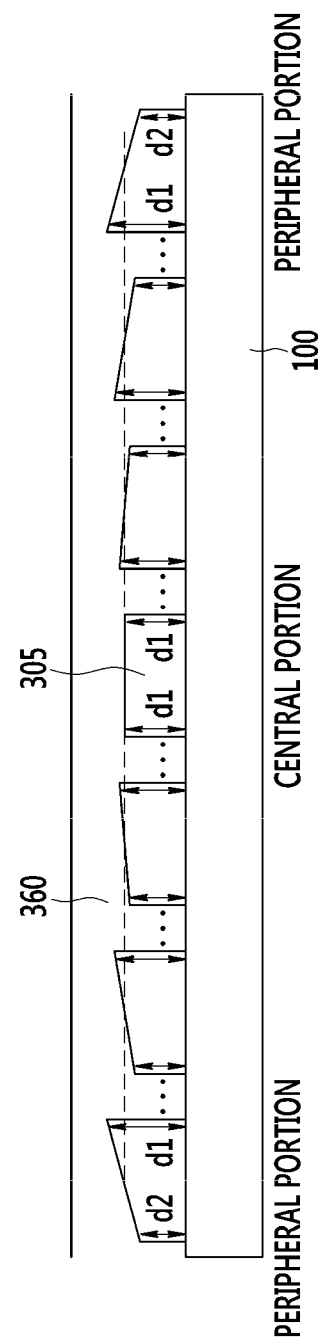
FIG. 27 is a cross-sectional view taken along the line II-II of FIG. 1.

The exemplary embodiment of FIG. 2 may be modified as illustrated in FIG. 27

Referring to FIG. 27, a mean value of the right/left cell gaps of the microcavity 305 is substantially constant from the central portion to the peripheral portion of the thin film transistor array panel 100, such that it is more advantageous in terms of luminance. In the present exemplary embodiment, a mean value of the right/left cell gaps of the microcavity 305 disposed at the central portion of the thin film transistor array panel 100 is substantially the same as a mean value of the right/left cell gaps of the microcavity 305 disposed at the peripheral portion thereof.

Hereinafter, arrangement of a liquid crystal material in a liquid crystal display according to an exemplary embodiment of the present invention will be described with reference to FIG. 3 to FIG. 6 by comparing it with the conventional case.

Figure 3:
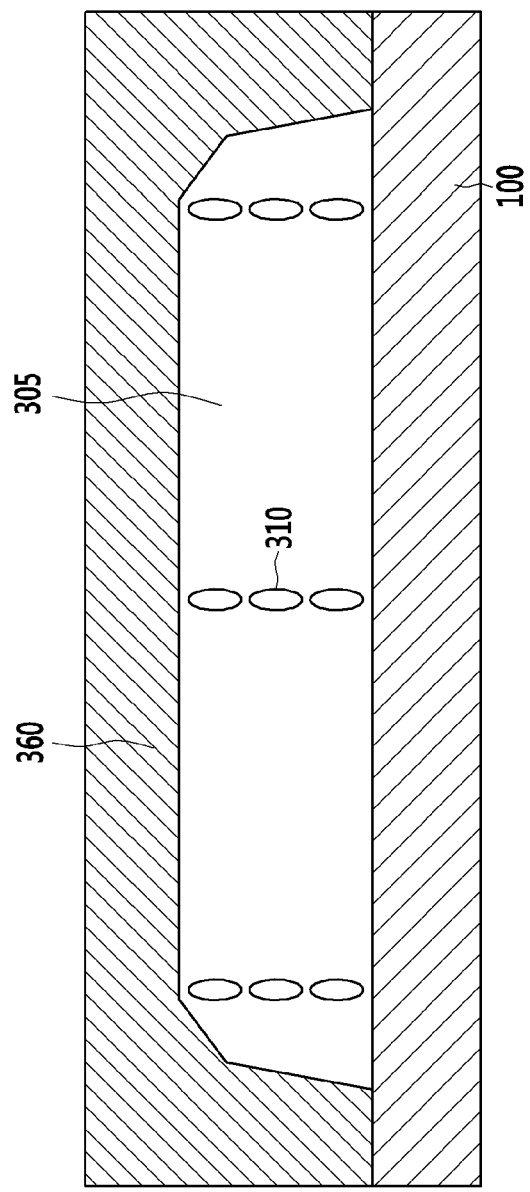
FIG. 3 is a cross-sectional view schematically illustrating a liquid crystal display in which a cell gap is constantly formed in a panel.
Figure 4:
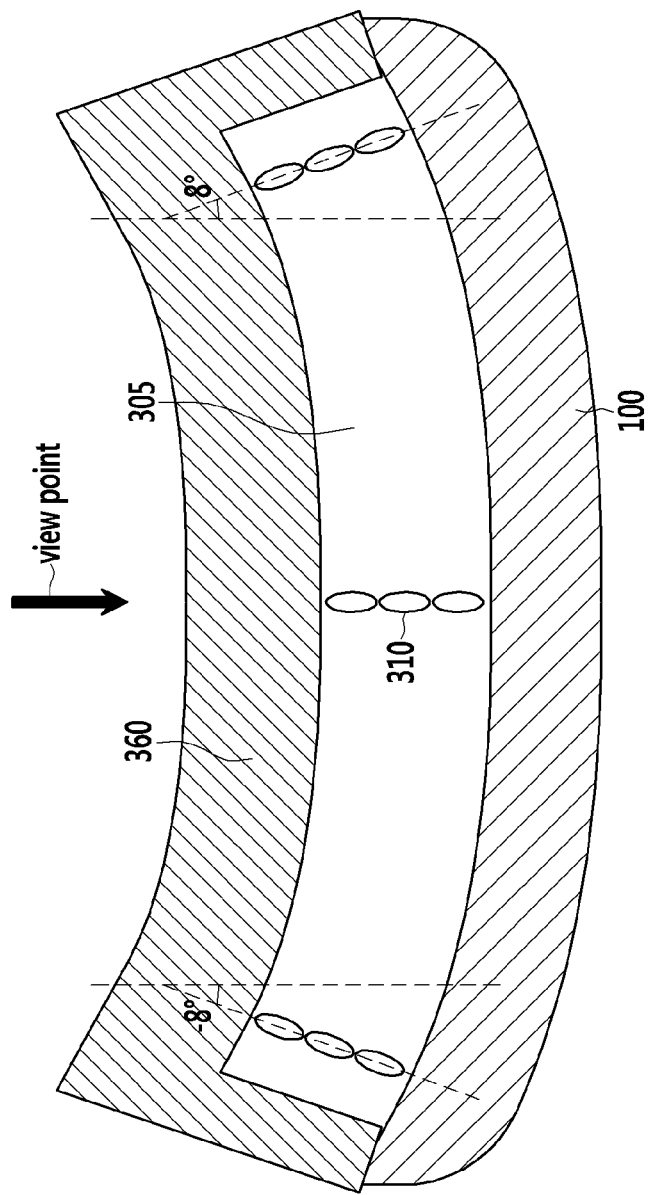
FIG. 4 is a cross-sectional view schematically illustrating how the liquid crystal display of FIG. 3 is bent.
Figure 5:
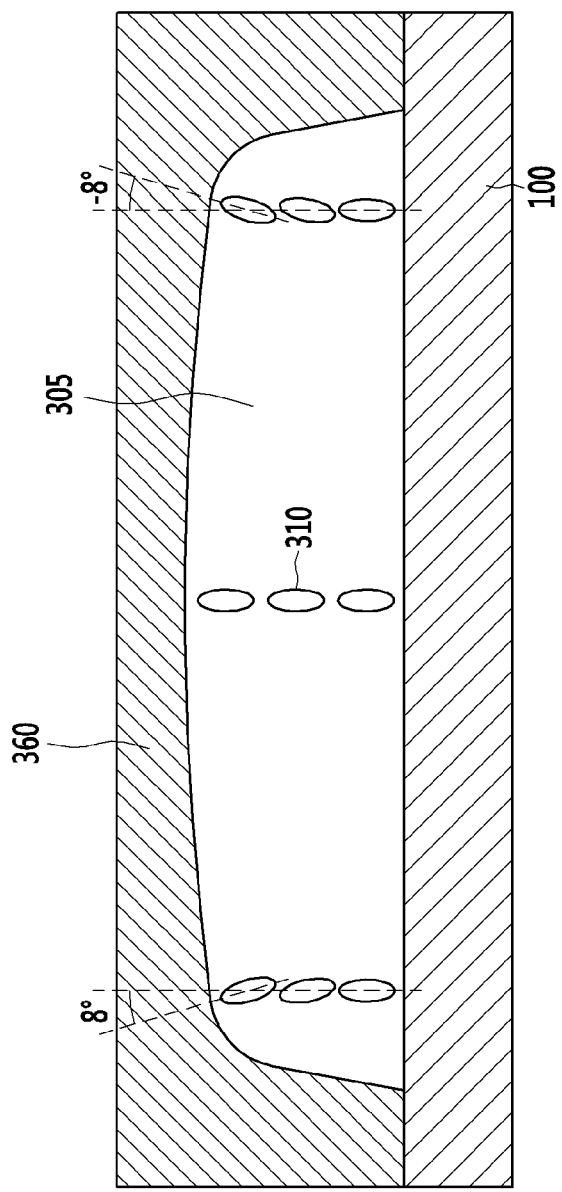
FIG. 5 is a cross-sectional view schematically illustrating a liquid crystal arrangement of an entire panel in a liquid crystal display according to an exemplary embodiment of the present disclosure.
Figure 6:
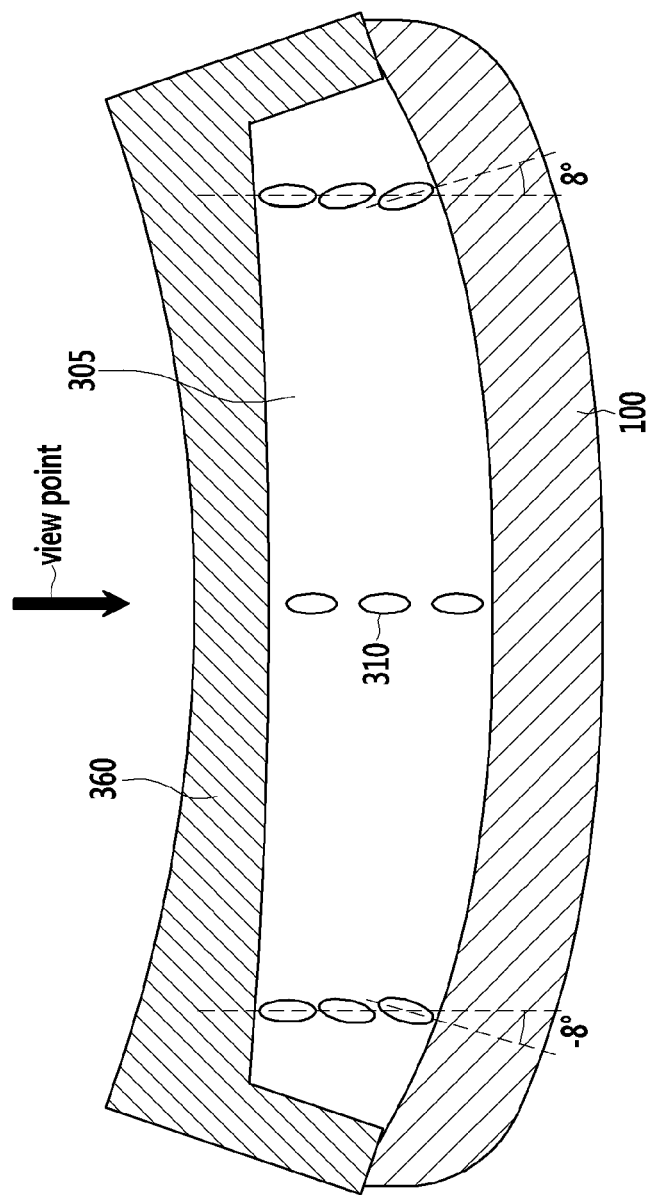
FIG. 6 is a cross-sectional view schematically illustrating how the liquid crystal display of FIG. 5 is bent.

FIG. 3 is a cross-sectional view schematically illustrating a liquid crystal display in which a cell gap is constantly formed in a panel. FIG. 4 is a cross-sectional view schematically illustrating how the liquid crystal display of FIG. 3 is bent. FIG. 5 is a cross-sectional view schematically illustrating a liquid crystal arrangement of an entire panel in a liquid crystal display according to an exemplary embodiment. FIG. 6 is a cross-sectional view schematically illustrating how the liquid crystal display of FIG. 5 is bent.

For convenience of description, the cross-sectional views of FIG. 3 to FIG. 6 show one single microcavity 305 instead of the partitioned microcavities 305 corresponding to the entire display area of the liquid crystal display, unlike in FIG. 2.

Referring to FIG. 3, when the cell gap is constant for the microcavities 305 disposed at the central portion and the peripheral portion of the thin film transistor array panel 100, a liquid crystal material 310 is substantially vertically aligned.

Referring to FIG. 4, when the liquid crystal display shown in FIG. 3 is bent to have a predetermined curvature radius (e.g., 600 R), the view point of a viewer and an optical axis of the liquid crystal material are aligned with each other at the central portion of the thin film transistor array panel 100, while an angle is generated between the view point of the viewer and the optical axis of the liquid crystal material by the curvature at the peripheral portion of the thin film transistor array panel 100. In FIG. 4, an angle of about 8 degrees is generated between the view point and the optical axis of the liquid crystal material at the peripheral portion. In this case, although it is assumed that the cell gaps are not changed, a difference in light visibility may be generated between the central portion and the peripheral portion of the thin film transistor array panel 100. For example, when a curvature is applied in a black state in which no electric field is applied, a light leakage phenomenon may be generated due to a retardation effect at the peripheral portion of the thin film transistor array panel 100, whereas such leakage is significantly less in the central portion.

This light visibility difference may cause a reduction in the degree of radiation variation even in a white state when an electric field is applied, thereby deteriorating the transmittance of the peripheral portion as compared with the central portion of the thin film transistor array panel 100.

However, referring to FIG. 2 and FIG. 5, the difference Δd between the maximum value and the minimum value of the cell gaps within the microcavity 305 is gradually increased as the position of the microcavity 305 shifts from the central portion toward the peripheral portion of the liquid crystal display. In the present exemplary embodiment, the roof layer 360 covering the microcavity 305 has a thickness that is gradually increased from the central portion to the peripheral portion of the thin film transistor array panel 100. The roof layer 360 has a bottom surface that is positioned to face the microcavity 305 and a top surface that is positioned to correspond to the bottom surface. In the present exemplary embodiment, the bottom surface of the roof layer 360 may have a curvature, and the top surface thereof may be parallel with the thin film transistor array panel 100. Accordingly, pretilt angles of the liquid crystal materials 310 disposed at an upper portion of the microcavity 305 and a lower portion thereof may be different from each other. This pretilt angle difference between the liquid crystal materials 310 disposed at the upper portion of the microcavity 305 and the lower portion thereof may be gradually increased from the central portion to the peripheral portion of the thin film transistor array panel 100. Herein, in the microcavity 305 disposed at the peripheral portion, the liquid crystal material 310 that is positioned to be adjacent to the thin film transistor array panel 100 may be substantially vertically aligned, and the liquid crystal material 310 that is positioned to be adjacent to the roof layer 360 may have a tilt angle.

Referring to FIG. 6, when the liquid crystal display shown in FIG. 5 is bent to have a predetermined curvature radius (e.g., 600 R in the present exemplary embodiment), the liquid crystal material 310 that is positioned to be adjacent to the roof layer 360 may be substantially vertically aligned, and the liquid crystal material 310 that is positioned to be adjacent to the thin film transistor array panel 100 may have a tilt angle in the microcavity 305 that is disposed to be adjacent to the peripheral portion of the thin film transistor array panel 100.

According to the liquid crystal continuous theory, the liquid crystal material 310 may be aligned to have a tilt angle that is gradually increased from the upper portion to the lower portion of the microcavity 305 disposed at the peripheral portion by a tilt angle difference between the upper portion and the lower portion of the microcavity 305. Accordingly, since the liquid crystal material 310 disposed at an upper portion of the peripheral portion of the liquid crystal display according to the present exemplary embodiment is vertically aligned to be substantially parallel to the view point, it is possible to minimize the degree of retardation variation between the central portion and the peripheral portion of the thin film transistor array panel 100, thereby improving visibility.

Figure 7:
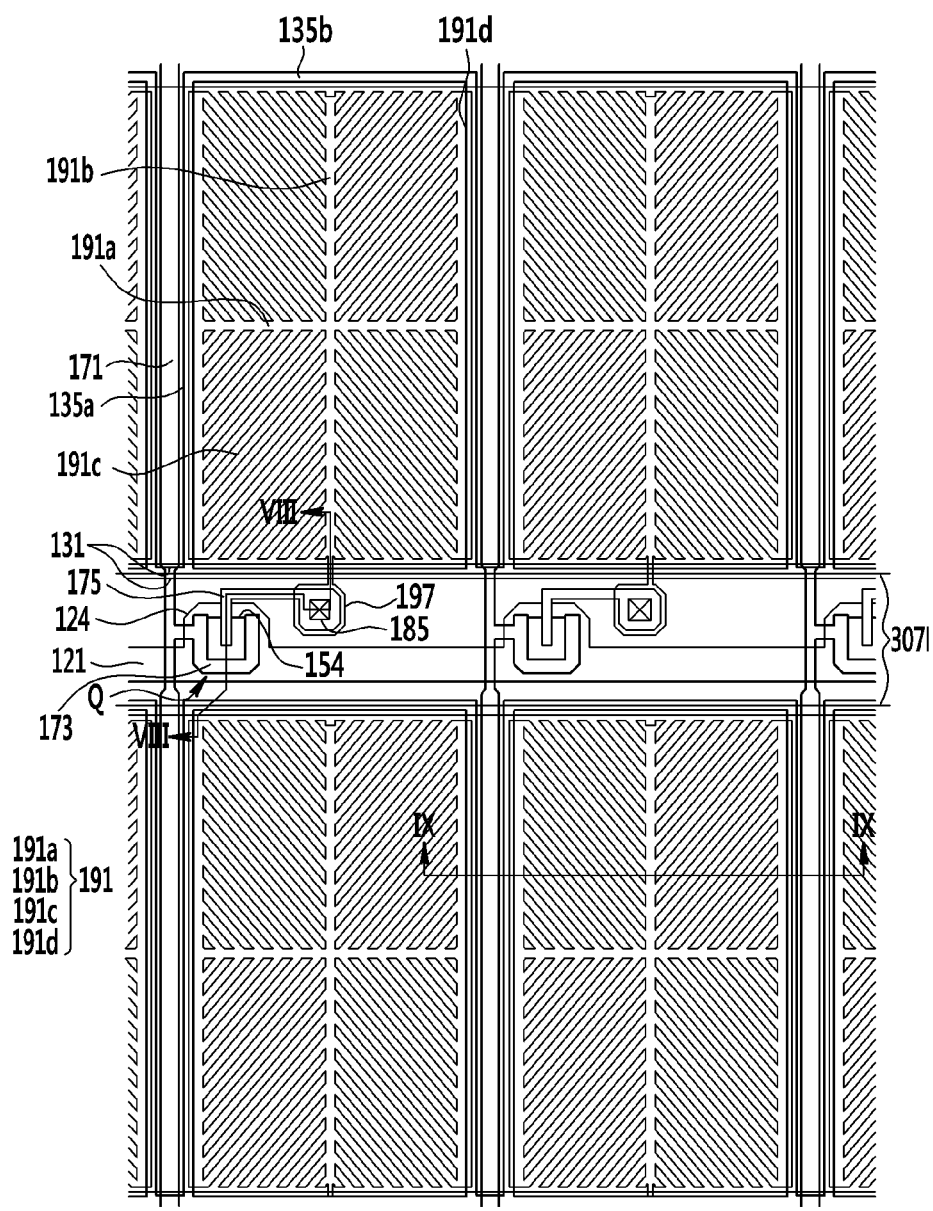
FIG. 7 is a top plan view showing a liquid crystal display according to an exemplary embodiment of the present disclosure.
Figure 8:
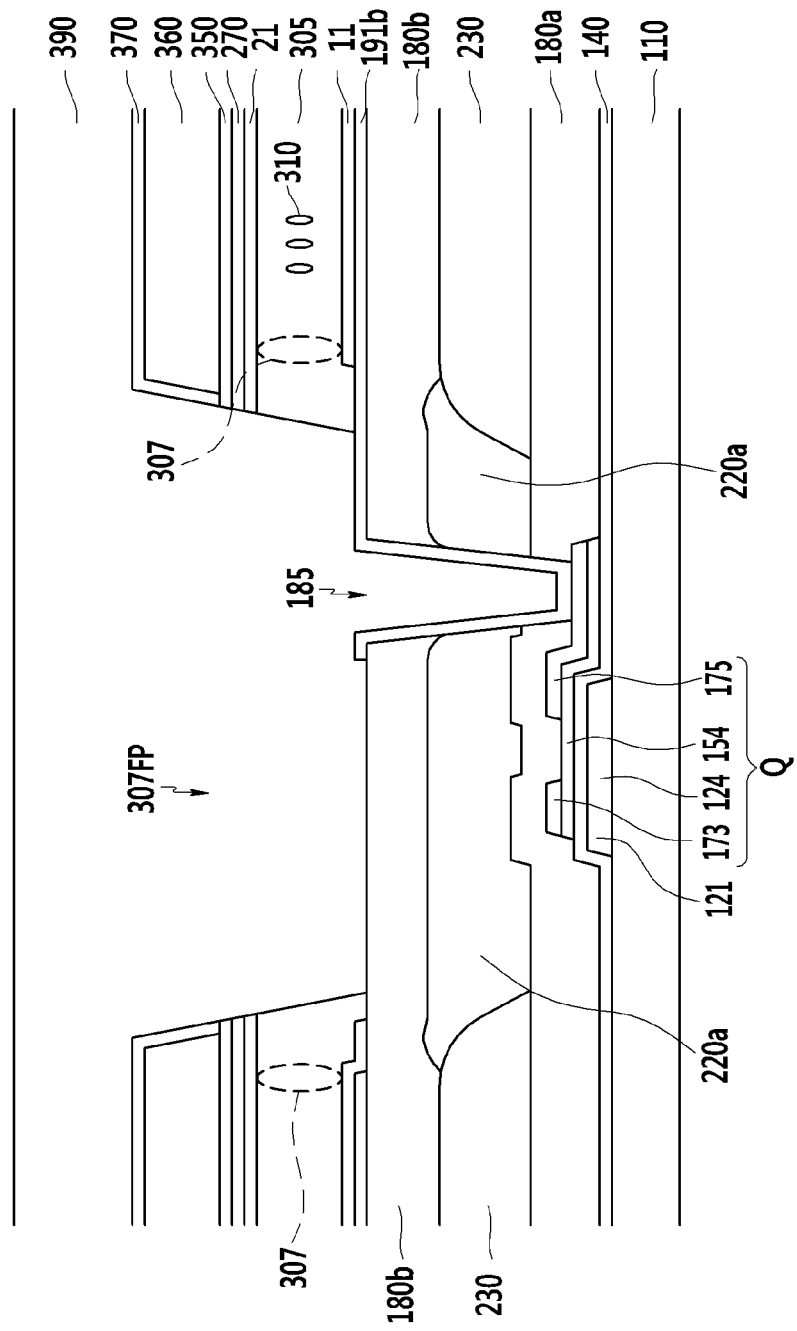
FIG. 8 is a cross-sectional view taken along the line VIII-VIII of FIG. 7.
Figure 9:
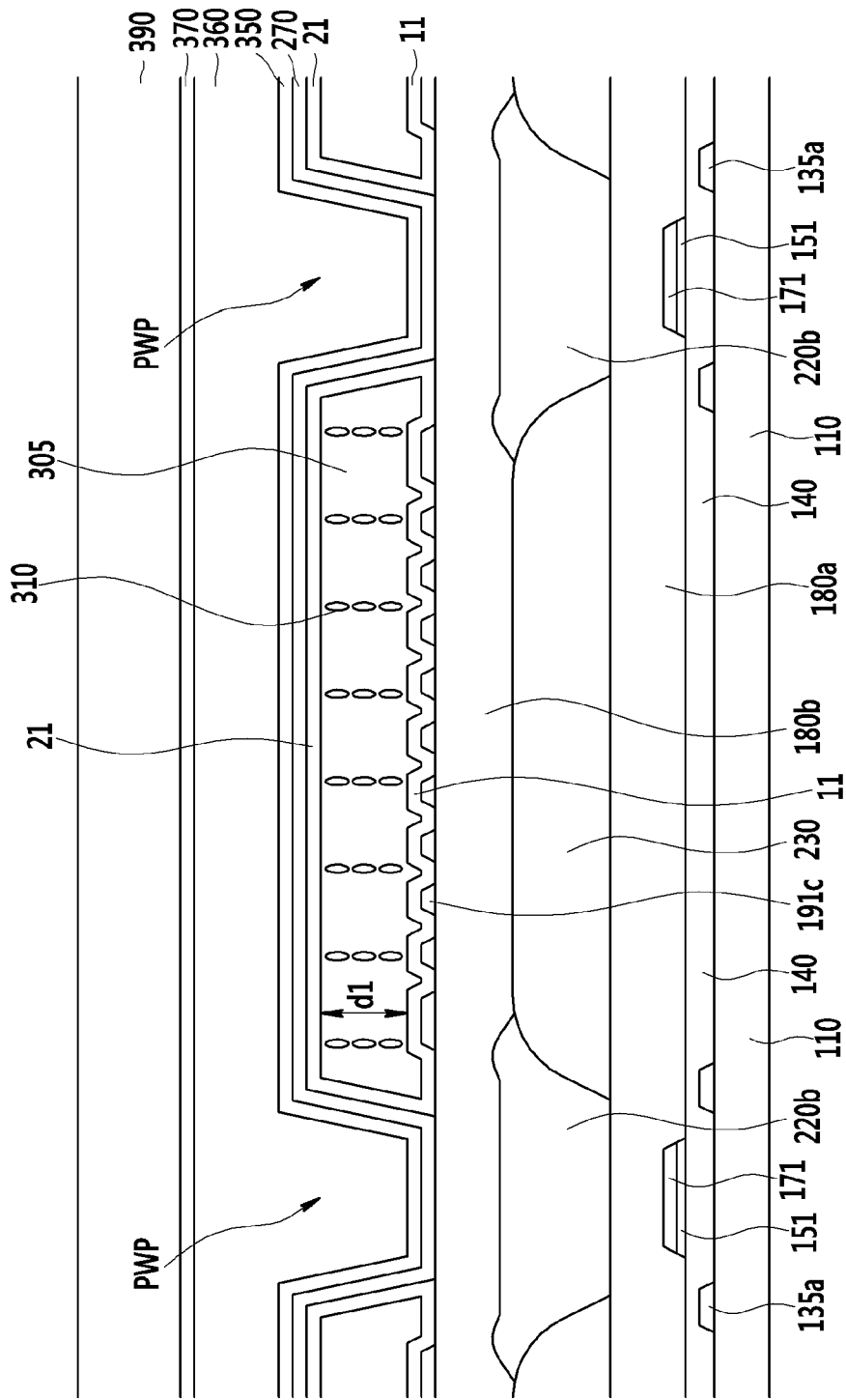
FIG. 9 is a cross-sectional view taken along the line IX-IX of FIG. 7 from a central portion of a panel.
Figure 10:
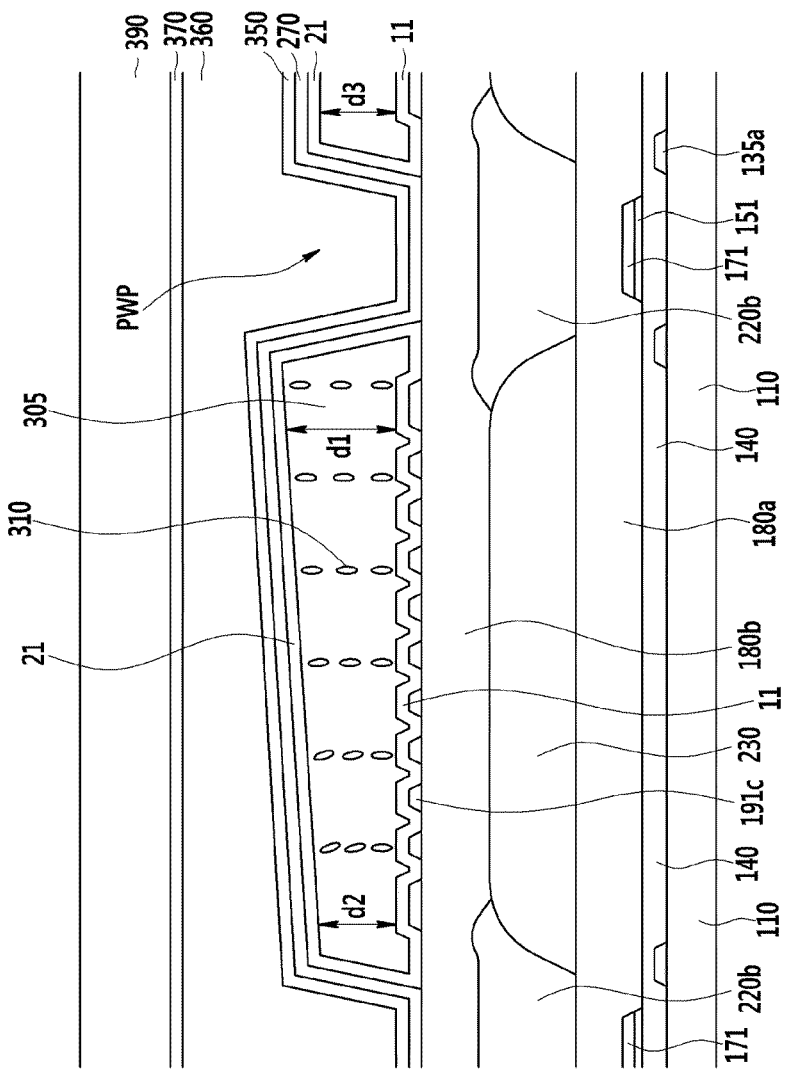
FIG. 10 is a cross-sectional view taken along the line IX-IX of FIG. 7 from a peripheral portion of the panel.

FIG. 7 is a top plan view showing a liquid crystal display according to an exemplary embodiment of the present disclosure. FIG. 8 is a cross-sectional view taken along the line VIII-VIII of FIG. 7. FIG. 9 is a cross-sectional view taken along the line IX-IX of FIG. 7 from a central portion of a panel. FIG. 10 is a cross-sectional view taken along the line IX-IX of FIG. 7 from a peripheral portion of the panel. FIG. 7 illustrates a 2×2 pixel portion A of a plurality of pixels that are respectively disposed to correspond to the microcavities 305, and this pixels may be repeatedly arranged up/down and right/left in the liquid crystal display according to the exemplary embodiment of the present disclosure.

Referring to FIG. 7 to FIG. 9, a gate line 121 and a storage electrode line 131 are formed on a substrate 110 made of transparent glass or plastic. The gate line 121 includes a gate electrode 124. The storage electrode line 131 mainly extends in a horizontal direction, and transfers a predetermined voltage such as a common voltage Vcom. The storage electrode line 131 includes a pair of vertical storage electrode portions 135a substantially extending to be perpendicular to the gate line 121, and a horizontal storage electrode portion 135b connecting ends of the pair of vertical storage electrode portions 135a to each other. The vertical and horizontal storage electrode portions 135a and 135b have a structure surrounding a pixel electrode 191.

A gate insulating layer 140 is formed on the gate line 121 and the storage electrode line 131. A semiconductor layer 151 disposed under a data line 171 and a semiconductor layer 154 positioned under a source/drain electrode and corresponding to a channel region of a thin film transistor Q are formed on the gate insulating layer 140.

A plurality of ohmic contacts may be formed between the semiconductor layer 151 and the data line 171, and between the semiconductor layer 154 under the source/drain electrode and corresponding to the channel region and the source/drain electrode, and are omitted in the drawings.

Data conductors 171, 173, and 175 including a source electrode 173, the data line 171 connected to the source electrode 173, and a drain electrode 175 are formed on the semiconductor layers 151 and 154 and the gate insulating layer 140.

The gate electrode 124, the source electrode 173, and the drain electrode 175 form a thin film transistor Q along with the semiconductor layer 154, and the channel of the thin film transistor Q is formed in the exposed portion of the semiconductor layer between the source electrode 173 and the drain electrode 175.

A first interlayer insulating layer 180a is formed on the data conductors 171, 173, and 175 and the exposed semiconductor layer 154. The first interlayer insulating layer 180a may include an inorganic insulator such as a silicon nitride (SiNx) and a silicon oxide (SiOx), or an organic insulator.

A color filter 230 and light blocking members 220a and 220b are formed on the first interlayer insulating layer 180a.

First, the light blocking members 220a and 220b have a lattice structure having an opening corresponding to an area displaying an image, and are formed of a material though which no light can pass. The color filter 230 is formed in each opening of the light blocking members 220a and 220b. The light blocking members 220a and 220b include a horizontal light blocking member 220a formed in a direction parallel with the gate line 121, and a vertical light blocking member 220b formed in a direction parallel to the data line 171.

The color filter 230 may display one of three primary colors such as red, green, and blue. However, it is not limited to the three primary colors such as red, green, and blue, and may display one of cyan, magenta, yellow, and white-based colors. The color filter 230 may be formed of materials displaying different colors for each adjacent pixel.

A second interlayer insulating layer 180b covering the color filter 230 and the light blocking members 220a and 220b is formed on the color filter 230 and the light blocking members 220a and 220b. The second interlayer insulating layer 180b may include the inorganic insulating material, such as a silicon nitride (SiNx) and a silicon oxide (SiOx), or the organic insulating material.

In a case where a step is generated due to a difference in a thickness between the color filter 230 and the light blocking members 220a and 220b, the second interlayer insulating layer 180b includes an organic insulating material, so that it is possible to decrease or remove the step.

The color filter 230, the light blocking members 220a and 220b, and the interlayer insulating layers 180a and 180b have a contact hole 185 exposing the drain electrode 175.

The pixel electrode 191 is disposed on the second interlayer insulating layer 180b. The pixel electrode 191 may be formed of a transparent conductive material, such as ITO or IZO.

An overall shape of the pixel electrode 191 is a quadrangle, and the pixel electrode 191 includes cross stems configured by a horizontal stem 191a and a vertical stem 191b crossing the horizontal stem 191a. Further, the pixel electrode 191 is divided into four sub-regions by the horizontal stem 191a and the vertical stem 191b, and each sub-region includes a plurality of minute branches 191c. In the present exemplary embodiment, the pixel electrode 191 may further include an outer stem 191d connecting the minute branches 191c at right and left edges of the pixel electrode 191. In the present exemplary embodiment, the outer stem 191d is positioned at the right and left edges of the pixel electrode 191, however it may be positioned to extend to an upper portion or a lower portion of the pixel electrode 191.

The minute branches 191c of the pixel electrode 191 form an angle of approximately 40° to 45° with the gate line 121 or the horizontal stem 191a. Further, the minute branches of two adjacent sub-regions may be perpendicular to each other. In addition, a width of each minute branch may be gradually increased, or a distance between the minute branches 191c may be varied.

The pixel electrode 191 includes an extension 197 which is connected at a lower end of the vertical stem 191b, has a larger area than the vertical stem 191b, and is electrically and physically connected to the drain electrode 175 through the contact hole 185 at the extension 197, thereby receiving the data voltage from the drain electrode 175.

The thin film transistor Q and the pixel electrode 191 described above are just examples, and a structure of the thin film transistor and a design of the pixel electrode may be modified in order to improve side visibility.

A lower alignment layer 11 is formed on the pixel electrode 191, and may be a vertical alignment layer. The lower alignment layer 11, as a liquid crystal alignment layer made of a material such as polyamic acid, a polysiloxane, a polyimide, or the like, may include at least one of generally used materials.

An upper alignment layer 21 is disposed at a portion facing the lower alignment layer 11, and a microcavity 305 is formed between the lower alignment layer 11 and the upper alignment layer 21. A liquid crystal material including liquid crystal molecules 310 is injected into the microcavity 305, and the microcavity 305 has an entrance region 307. The microcavities 305 may be formed along a column direction of the pixel electrode 191, that is, in the vertical direction. In the present exemplary embodiment, the alignment material forming the alignment layers 11 and 21 and the liquid crystal material including the liquid crystal molecules 310 may be injected into the microcavity 305 by using capillary force. In the present exemplary embodiment, the lower alignment layer 11 and the upper alignment layer 21 are merely distinguished according to position, and may be connected to each other as shown in FIG. 4. The lower alignment layer 11 and the upper alignment layer 21 may be simultaneously formed.

The microcavity 305 is divided in the vertical direction by a plurality of liquid crystal injection portion 307FP positioned at a portion overlapping the gate line 121, thereby forming the plurality of microcavities 305, and a plurality of microcavities 305 may be formed along a column direction of the pixel electrode 191, that is, in the vertical direction. Further, the microcavity 305 is divided in the horizontal direction by a partition PWP that will be described later, thereby forming a plurality of microcavities 305, and the microcavities 305 may be formed along the row direction of the pixel electrode 191, that is, the horizontal direction in which the gate line 121 extends. The microcavities 305 may respectively correspond to one or more pixel areas, and the pixel areas may correspond to a region displaying the image.

A common electrode 270 and a lower insulating layer 350 are positioned on the upper alignment layer 21. The common electrode 270 receives the common voltage, and generates an electric field together with the pixel electrode 191 to which the data voltage is applied to determine a direction in which the liquid crystal molecules 310 positioned at the microcavity 305 between the two electrodes are inclined. The common electrode 270 forms a capacitor with the pixel electrode 191 to maintain the received voltage even after the thin film transistor is turned off. The lower insulating layer 350 may be formed of a silicon nitride (SiNx) or a silicon oxide (SiOx).

In the present exemplary embodiment, it is described that the common electrode 270 is formed on the microcavity 305, but in another exemplary embodiment, the common electrode 270 is formed under the microcavity 305, so that liquid crystal driving according to a coplanar electrode (CE) mode is possible.

The roof layer 360 is disposed on the lower insulating layer 350. The roof layer 360 serves as a support so that the microcavity 305, which is a space between the pixel electrode 191 and the common electrode 270, is formed. The roof layer 360 may include silicon oxycarbide (SiOC), a photoresist, or other organic materials. In the present exemplary embodiment, the roof layer 360 of the center portion may be formed to have substantially the same thickness in a horizontal direction.

An upper insulating layer 370 is disposed on the roof layer 360. The upper insulating layer 370 may contact the upper surface of the roof layer 360. The upper insulating layer 370 may be formed of a silicon nitride (SiNx) or a silicon oxide (SiOx). As shown in FIG. 8, the upper insulating layer 370 may be disposed to cover the side surface of the roof layer 360.

In the present exemplary embodiment, a capping layer 390 is also disposed at the liquid crystal injection portion 307FP and the entrance region 307 of the microcavity 305 exposed by the liquid crystal injection portion 307FP. The capping layer 390 includes the organic material or the inorganic material.

As shown in FIG. 9, in the present exemplary embodiment, the partition PWP is formed between horizontally neighboring microcavities 305. The partition PWP may extend along the data line 171, and may be covered by the capping layer 390. The lower insulating layer 350, the common electrode 270, the upper insulating layer 370, and the roof layer 360 are filled in the partition PWP, and this structure forms the partition wall to partition or define the microcavity 305. In the present exemplary embodiment, a partition structure such as the partition PWP is disposed between the microcavities 305. Accordingly, even though the substrate 110 is bent, less stress may be generated and a degree at which the cell gap is deformed may be reduced.

The structure of the peripheral portion shown in FIG. 10 is mostly similar to the structure of the central portion shown in FIG. 9, but the cell gaps d1 and d2 of the microcavity 305 disposed at the peripheral portion are different. A left side of the cross-section shown in FIG. 10 is positioned farther from the central portion of the substrate 110. The thickness of the roof layer 360 disposed to correspond to the microcavity 305 disposed at the peripheral portion may be increased at a position that is more separated from the central portion. In this case, the first cell gap d1 may be the same as the cell gap d1 of the central portion, and a minimum value d3 of cell gaps of a microcavity that is rightwardly adjacent to the microcavity 305 having the maximum value of the first cell gap d1 and the minimum value of the second cell gap d2 may be greater than the second cell gap d2.

Next, an exemplary embodiment for a manufacturing method of the above-described liquid crystal display will be described with reference to FIG. 11 to FIG. 26. An exemplary embodiment to be described below may be varied as an exemplary embodiment of the manufacturing method.

FIG. 11 to FIG. 26 are cross-sectional views showing a manufacturing method of a liquid crystal display according to an exemplary embodiment of the present invention. FIGS. 11, 14, 17, 20, 21, and 24 sequentially illustrate cross-sectional views taken along the line VIII-VIII of FIG. 7. FIGS. 12, 15, 18, 22, and 25 sequentially illustrate cross-sectional views taken along the line IX-IX of FIG. 7 from a central portion of a panel. FIGS. 13, 16, 19, 23, and 26 sequentially illustrate cross-sectional views taken along the line IX-IX of FIG. 7 from a peripheral portion of the panel.

Figure 11:
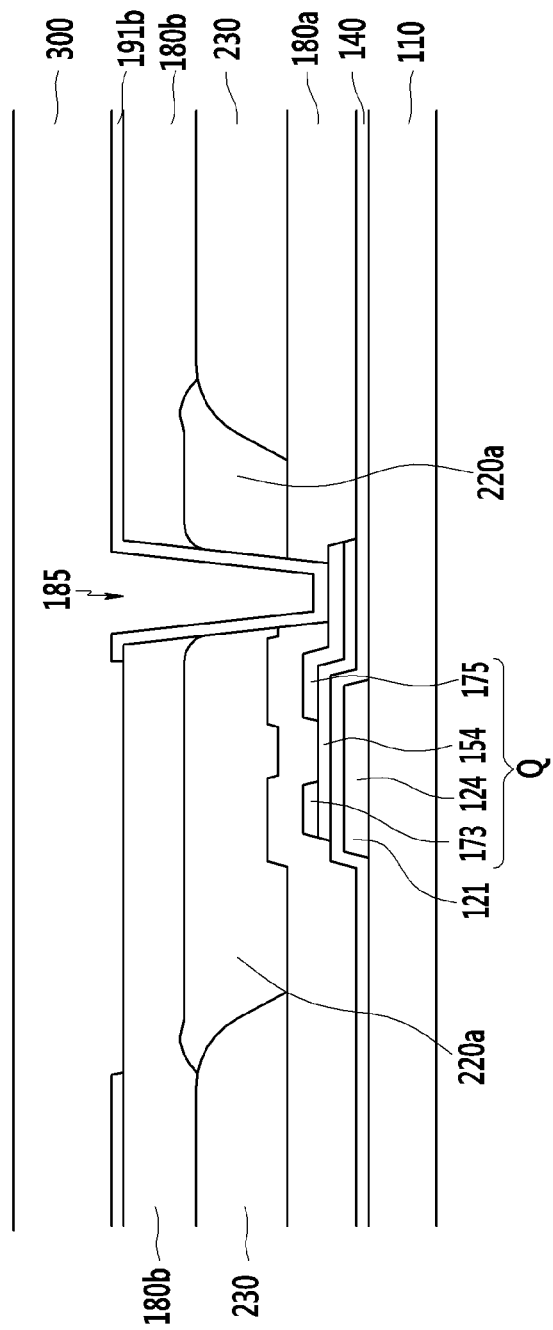
FIGS. 11, 12, 13, 14, 15, 16, 17, 18, 19, 20, 21, 22, 23, 24, 25, and FIG. 26 are cross-sectional views showing a manufacturing method of a liquid crystal display according to an exemplary embodiment of the present disclosure.
Figure 12:
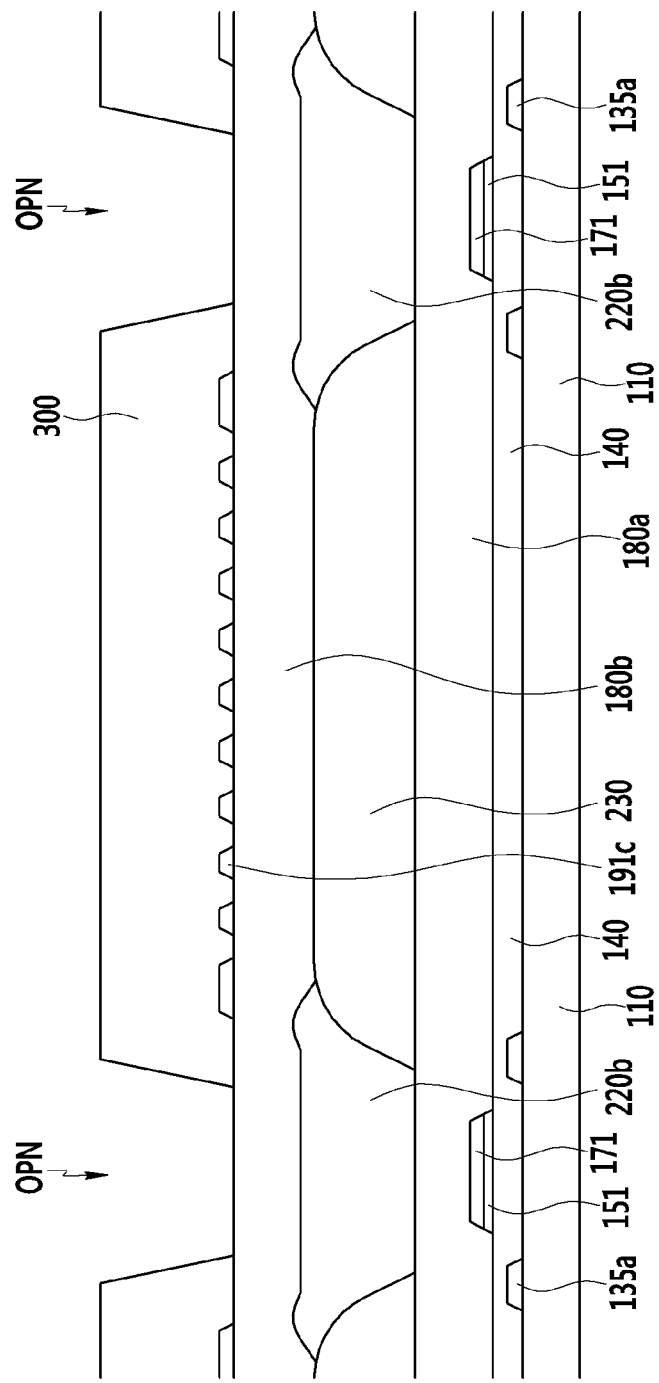

Referring to FIG. 7, FIG. 11, and FIG. 12, to form a generally known switching element on a substrate 110, a gate line 121 extending in a horizontal direction and a gate insulating layer 140 on the gate line 121 are formed, semiconductor layers 151 and 154 are formed on the gate insulating layer 140, and a source electrode 173 and a drain electrode 175 are formed. In this case, the data line 171 connected to the source electrode 173 may be formed to extend in a vertical direction while crossing the gate line 121.

The first interlayer insulating layer 180a is formed on the data conductors 171, 173, and 175 including the source electrode 173, the drain electrode 175, and the data line 171, and the exposed portion of the semiconductor layer 154.

The color filter 230 is formed at a position corresponding to the pixel area on the first interlayer insulating layer 180a, and the light blocking members 220a and 220b are formed between the color filters 230. When the light blocking members 220a and 220b are formed, the light blocking layer 221 disposed at the peripheral portion may also be formed together with them.

The second interlayer insulating layer 180b is formed to cover the color filter 230 and the light blocking members 220a and 220b, and the second interlayer insulating layer 180b is formed to have the contact hole 185 electrically and physically connecting the pixel electrode 191 and the drain electrode 175.

Thereafter, the pixel electrode 191 is formed on the second interlayer insulating layer 180b, and a sacrificial layer 300 is formed on the pixel electrode 191. As illustrated in FIG. 12, an open portion OPN is formed in the sacrificial layer 300 in a direction parallel with the data line 171. In a subsequent process, the common electrode 270, the lower insulating layer 350, the roof layer 360, and the upper insulating layer 370 are filled in the open portion OPN to form the partition wall formation portion PWP.

Figure 13:
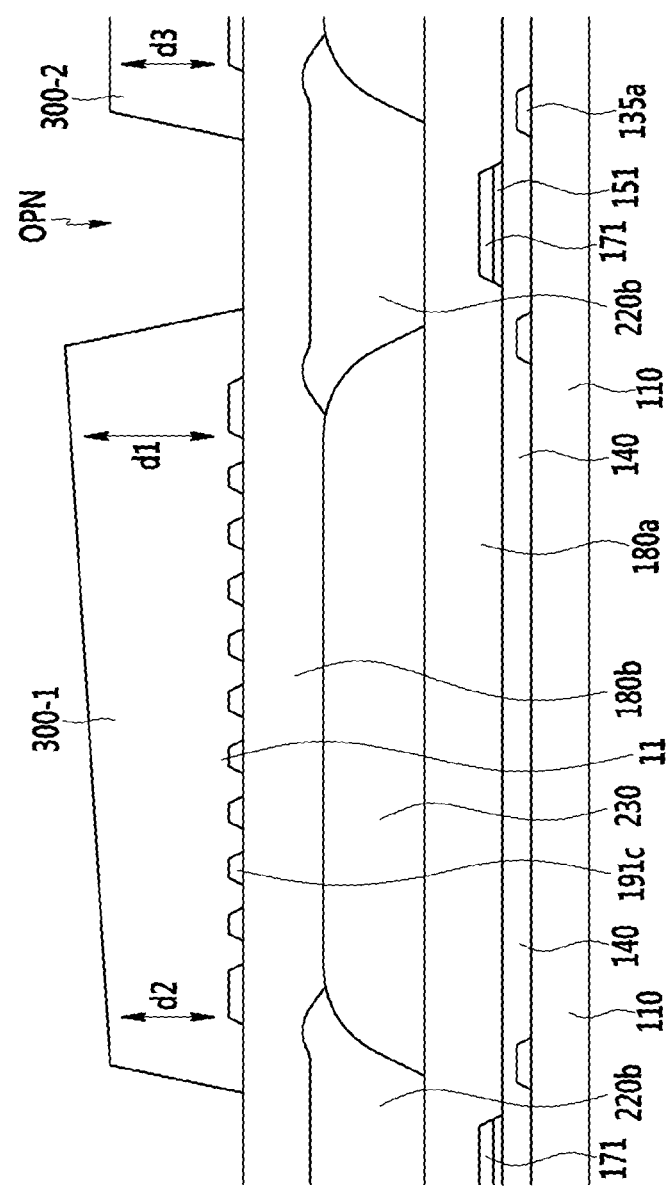

Referring to FIG. 13, in a first sacrificial layer pattern 300-1 disposed at the peripheral portion, a height difference between the maximum value d1 and the minimum value d2 at two ends of the first sacrificial layer 300-1 is increased at a position farther away from the central portion of the panel. A left side of the cross-section shown in FIG. 13 is farther from the central portion of the substrate 110 than the right side of FIG. 13. The sacrificial layer pattern 300 (which collectively refers to 300-1, 300-2, etc.) may indicate sacrificial layer patterns 300-1, 300-2, etc. corresponding to each microcavity 305. The thickness of the sacrificial layer pattern 300-1 disposed at the peripheral portion may be reduced at a position that is farther from the central portion. In the embodiment of FIG. 13, the first thickness d1 may be the same as the thickness of the sacrificial layer pattern 300-*i* disposed at the central portion. A minimum value d3 of a third thickness of a sacrificial layer pattern 300-2 that is between the sacrificial layer pattern 300-1 and the central sacrificial layer pattern 300-*i*, may have the maximum value of the first thickness d1 and the minimum value of the second thickness d2. In one embodiment, the value d3 of the sacrificial layer 300-*s* may be greater than the second thickness d2. A slit mask may be employed to form the sacrificial layer pattern 300. This slit mask may have a structure for gradually changing the optical transmittance at portions corresponding to each microcavity being farther from the central portion of the panel.

Figure 14:
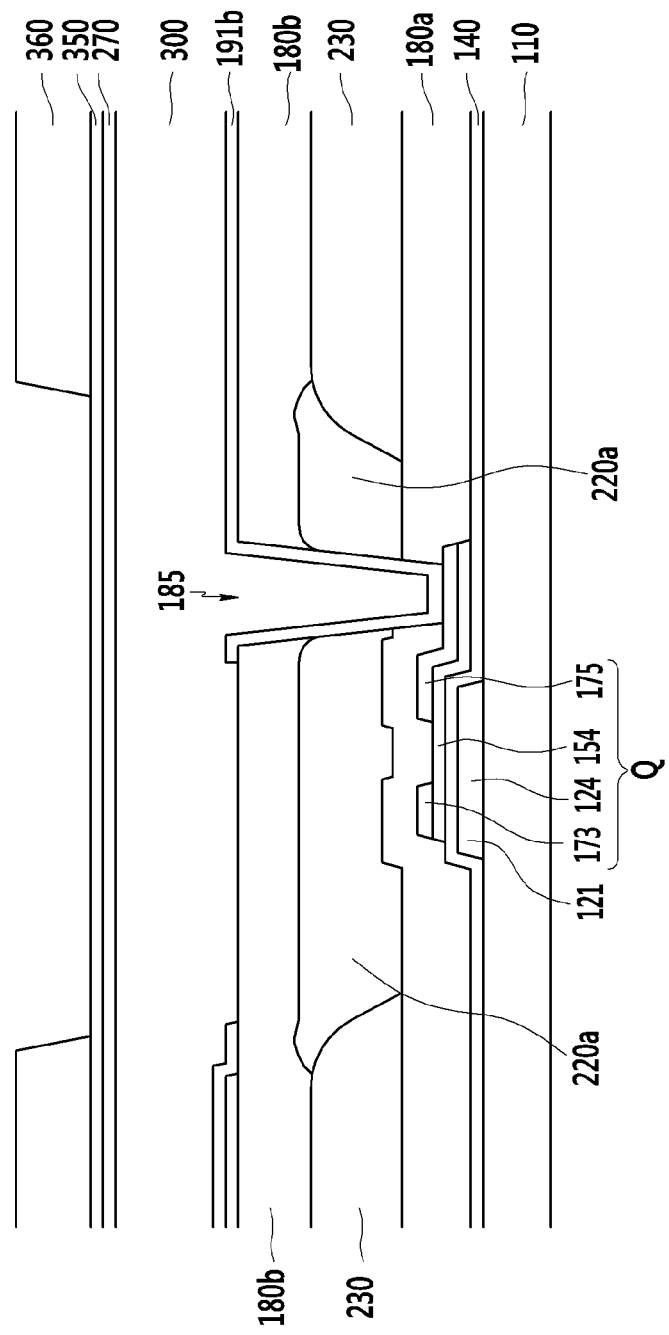
Figure 15:
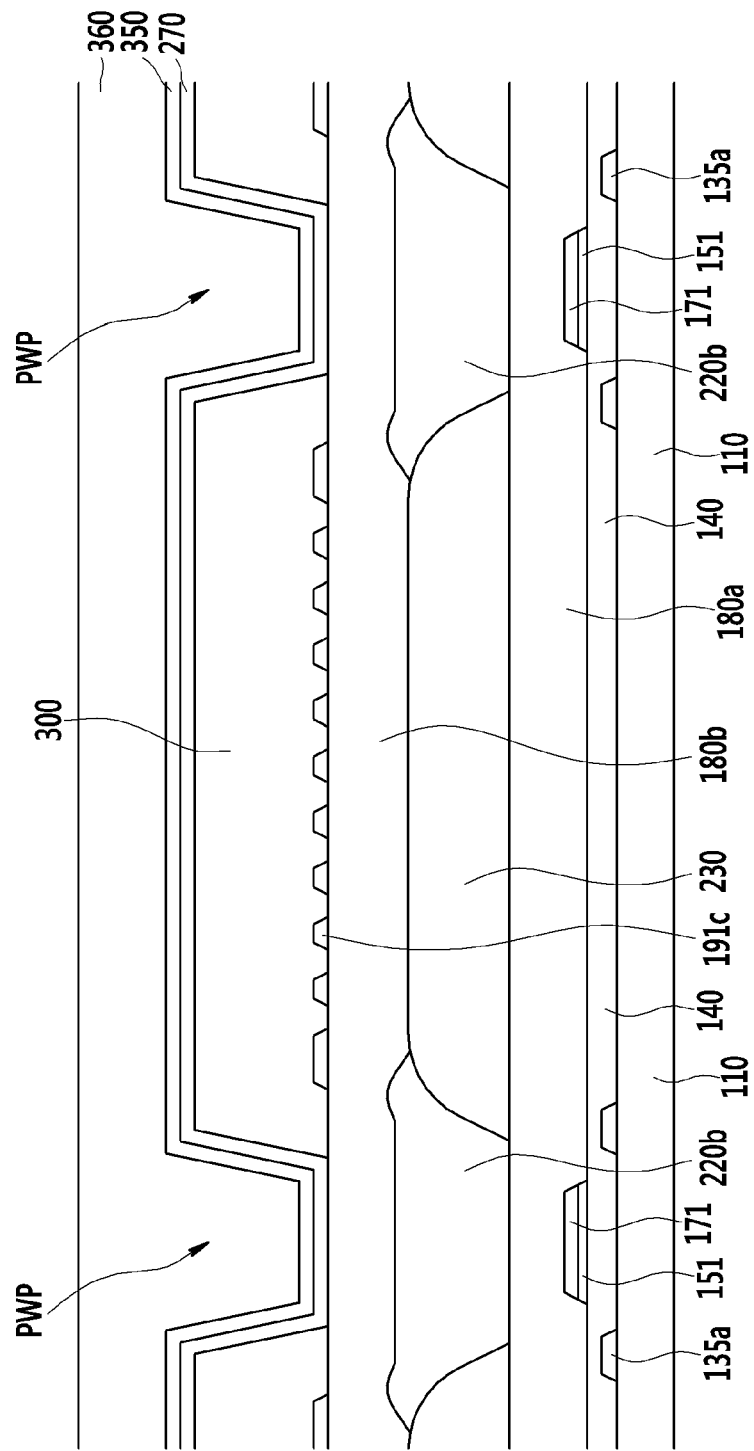
Figure 16:
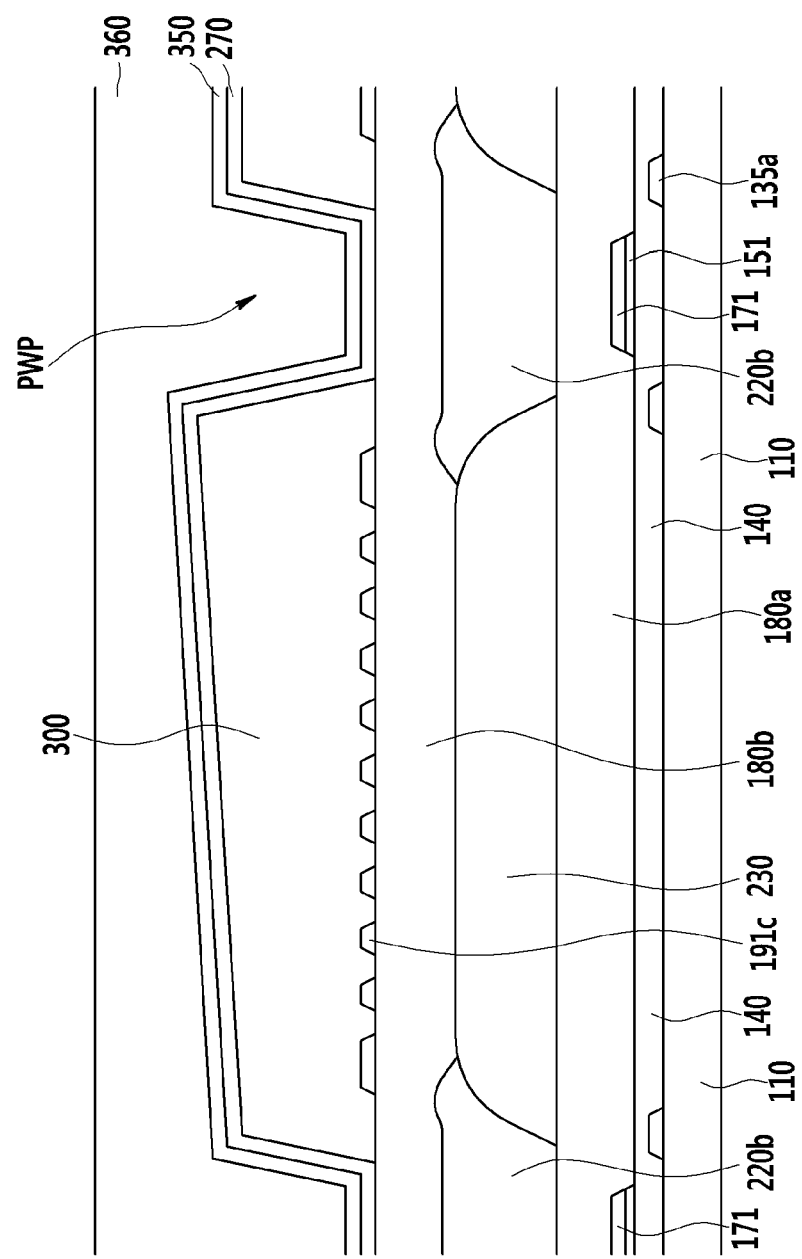

Referring to FIG. 14 and FIG. 16, the common electrode 270, the lower insulating layer 350, and the roof layer 360 are sequentially formed on the sacrificial layer 300. In FIG. 14 and FIG. 16, the central portion of the panel is to the right of the portion that is depicted. The roof layer 360 may be removed at the region corresponding to the horizontal light blocking member 220*a* disposed between the pixel areas adjacent in the vertical direction by an exposure and development process. The roof layer 360 exposes the lower insulating layer 350 in the region corresponding to the horizontal light blocking member 220*a*. In this case, the common electrode 270, the lower insulating layer 350, and the roof layer 360, as shown in FIG. 15 and FIG. 16, fill the open portion OPN of the vertical light blocking member 220*b*, thereby forming the partition forming portion PWP. As shown in FIG. 16, a thickness of a portion of the roof layer 360 to correspond to the sacrificial layer pattern 300 disposed at the peripheral portion of the panel may increase with distance from the central portion of the panel.

Figure 17:
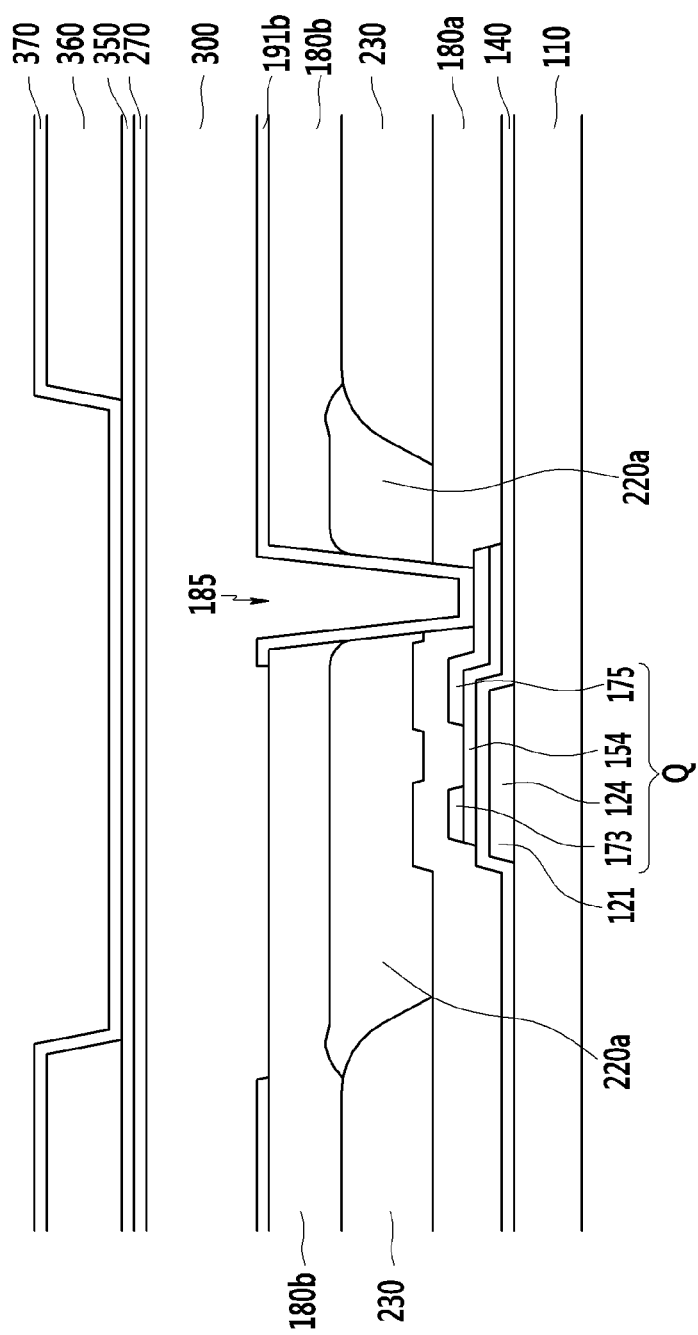
Figure 18:
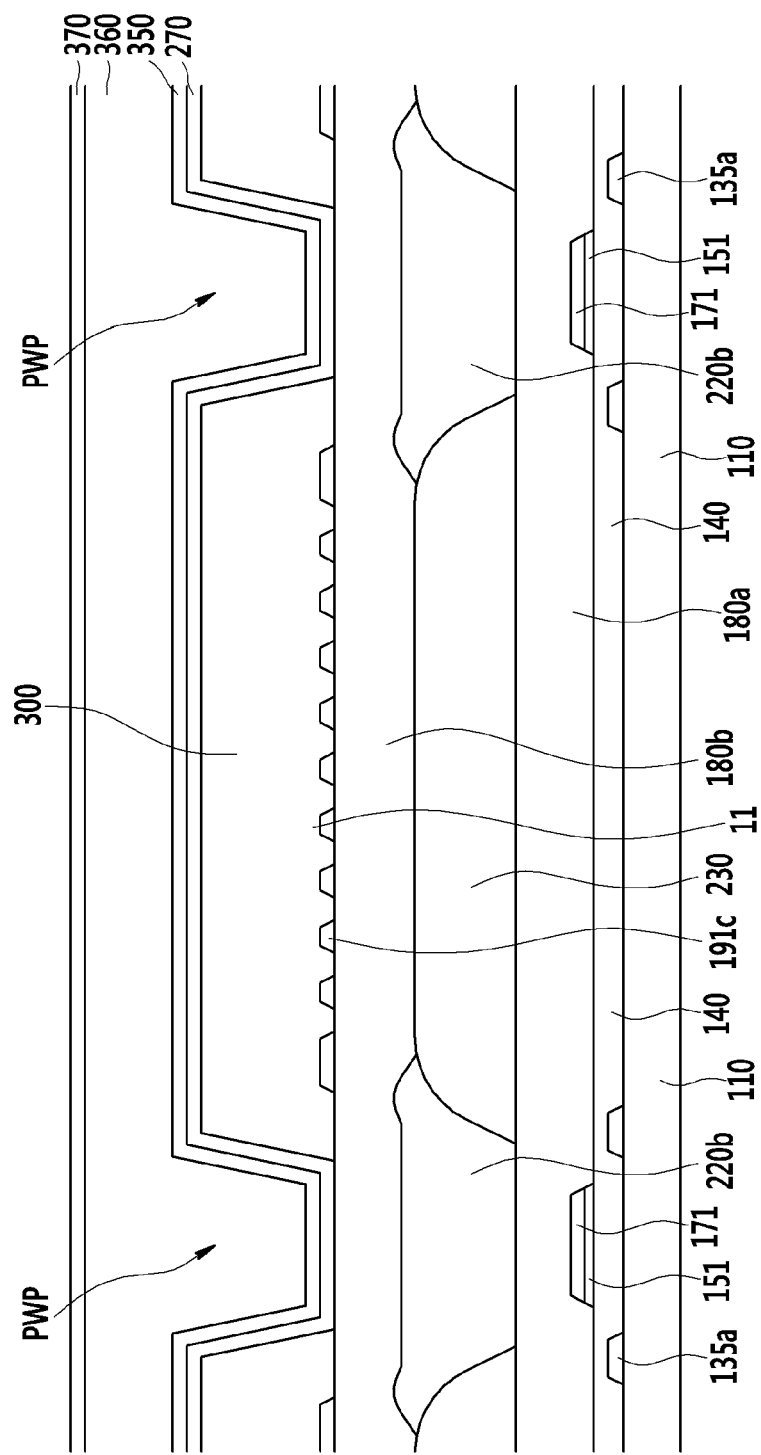
Figure 19:
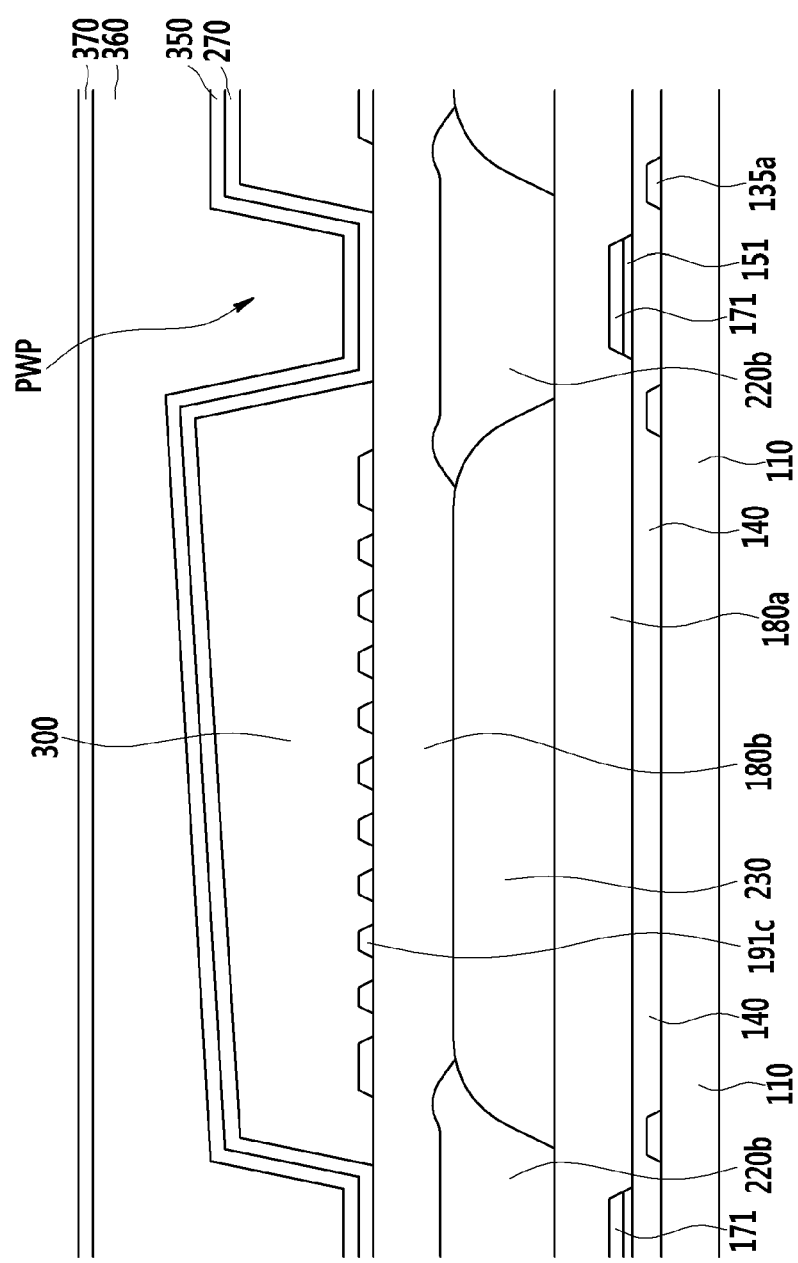

Referring to FIG. 17 to FIG. 19, the upper insulating layer 370 is formed in such a way so as to cover upper portions of the roof layer 360 and the exposed lower insulating layer 350.

Figure 20:
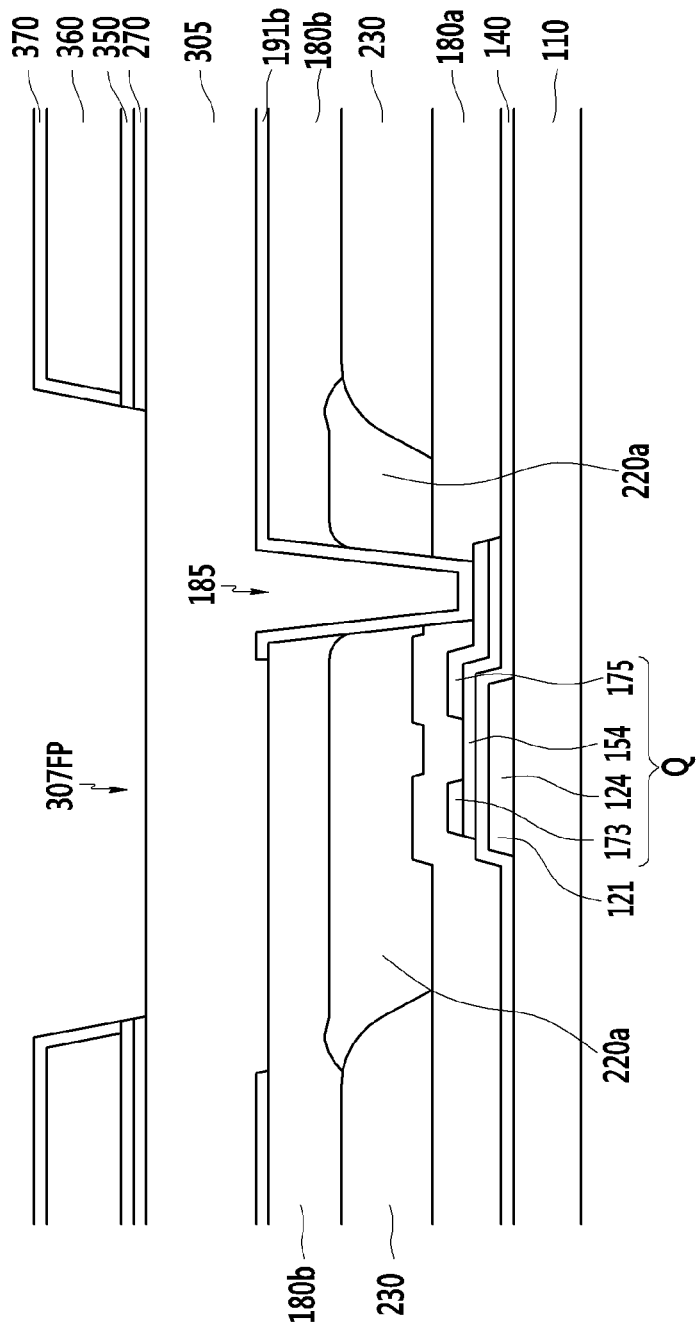

Referring to FIG. 20, the upper insulating layer 370, the lower insulating layer 350, and the common electrode 270 are etched to partially remove the upper insulating layer 370, the lower insulating layer 350, and the common electrode 270, and to form the liquid crystal injection portion 307FP. In this case, the upper insulating layer 370 has a structure covering the side surface of the color filter 230; however, this is not a limitation of the disclosure, and the upper insulating layer 370 covering the side surface of the color filter 230 may be removed to expose the side surface of the color filter 230 to the outside.

Figure 21:
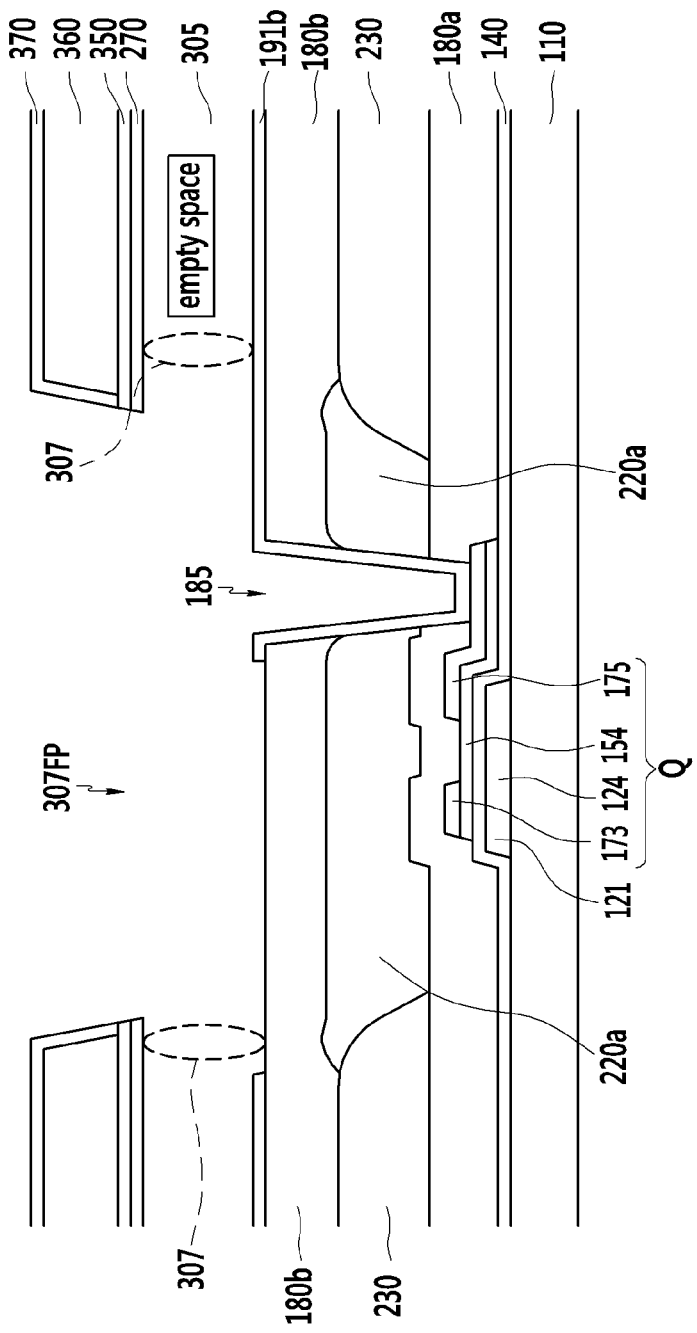
Figure 22:
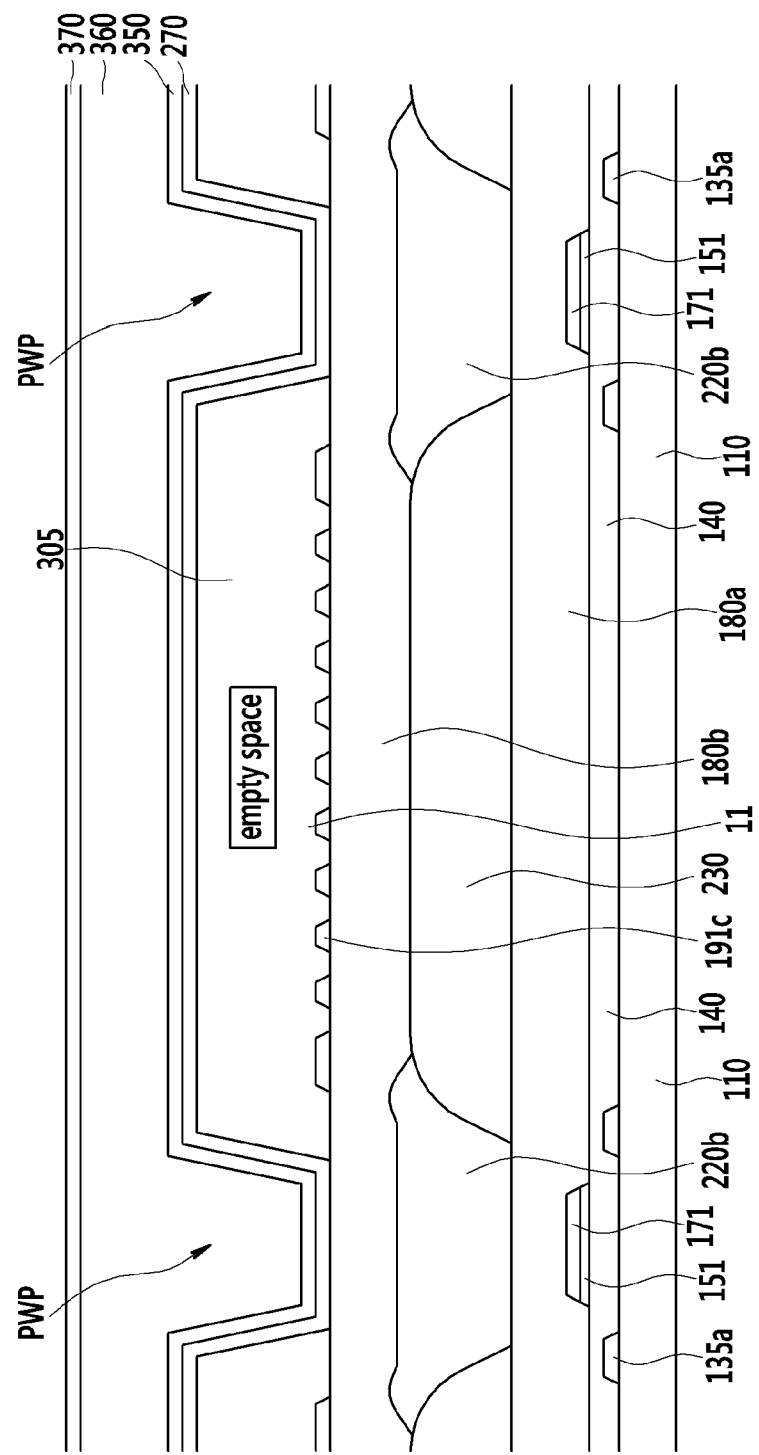
Figure 23:
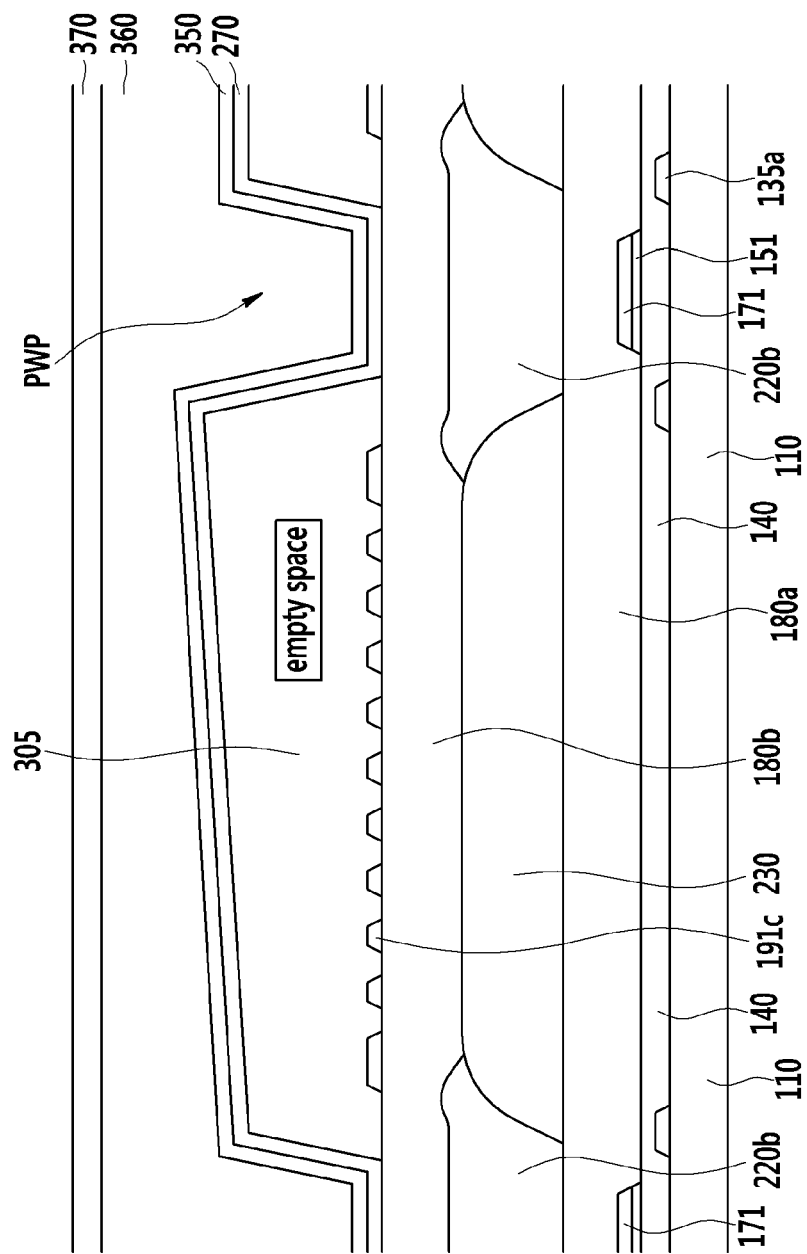

Referring to FIG. 21 to FIG. 23, the sacrificial layer pattern 300 is removed by an oxygen ($O_2$) ashing process or a wet-etching method through the liquid crystal injection portion 307FP. In this case, the microcavity 305 having the entrance region 307 is formed. The microcavity 305 is an empty space formed when the sacrificial layer 300 is removed.

Figure 24:
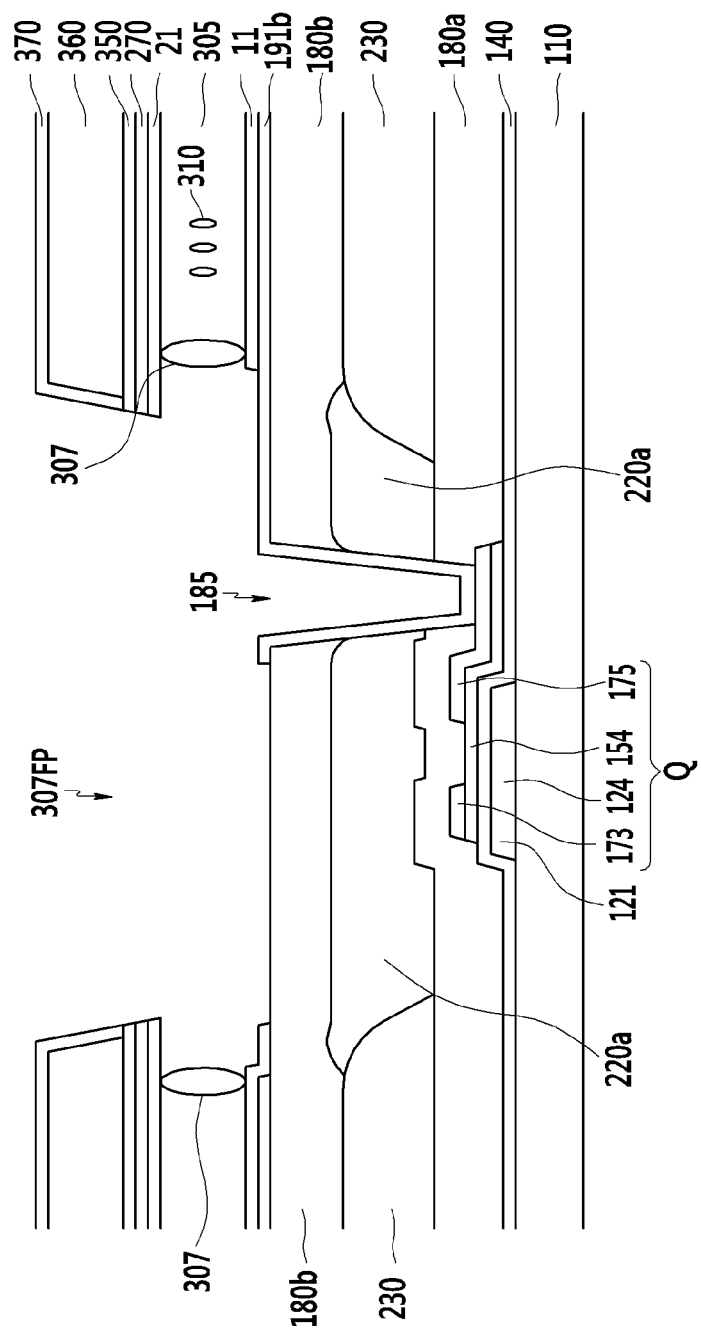
Figure 25:
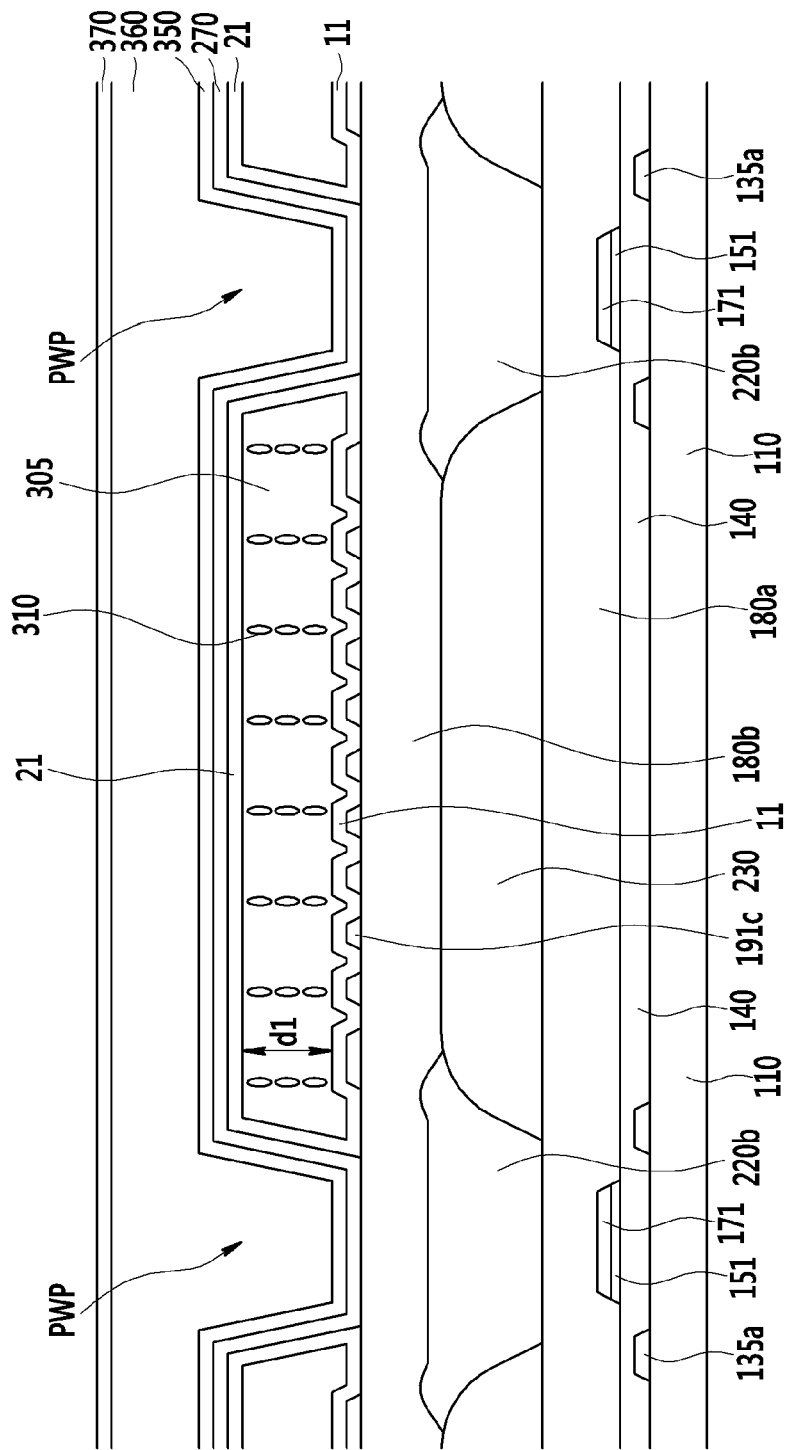
Figure 26:
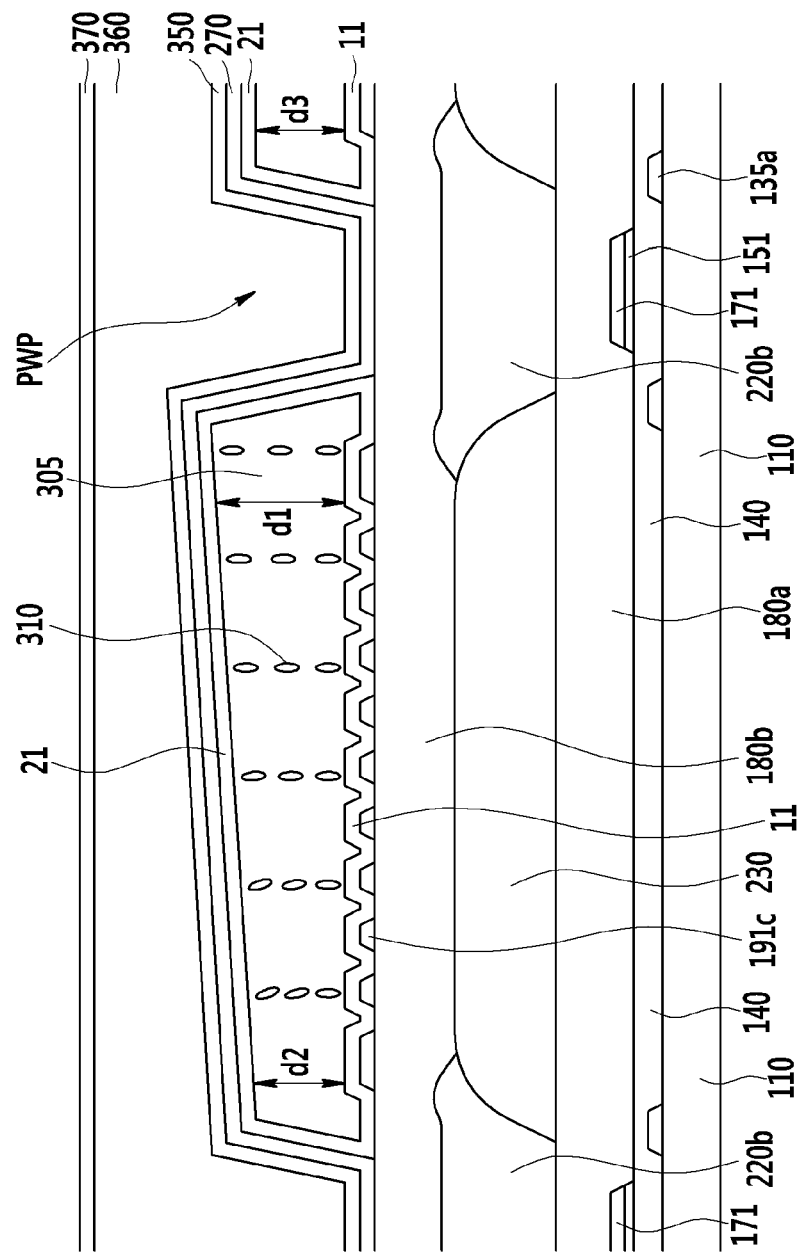

Referring to FIG. 24 to FIG. 26, the alignment material is injected through the entrance region 307 to form the alignment layers 11 and 21 on the pixel electrode 191 and the common electrode 270. In detail, a bake process is performed after injecting an alignment material including a solid content and a solvent through the entrance region 307.

Next, a liquid crystal material including the liquid crystal molecules 310 is injected into the microcavity 305 via the entrance region 307, using an inkjet method and the like.

Thereafter, the capping layer 390 is formed on the insulating layer 350 to cover the entrance region 307 and the liquid crystal injection portion 307FP to form the liquid crystal display illustrated in FIG. 7 to FIG. 10.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of Symbols> | | | |
|---|---|---|---|
| 300 | sacrificial layer | 305 | microcavities |
| 307 | entrance region | 307FP | liquid crystal injection portion |
| 350 | lower insulating layer | 360 | roof layer |
| 370 | upper insulating layer | 390 | capping layer |

What is claimed is:

1. A liquid crystal display comprising:
a substrate having a central portion;
a thin film transistor disposed on the substrate;
a pixel electrode connected to the thin film transistor;
a roof layer disposed to face the pixel electrode; and
a liquid crystal layer disposed between the pixel electrode and the roof layer and formed by a plurality of microcavities,
wherein the microcavities hold a liquid crystal material,
wherein a difference between a maximum cell gap and a minimum cell gap in each of the microcavities increases with distance from the central portion of the substrate.

2. The liquid crystal display of claim 1, wherein a pretilt angle of the liquid crystal material disposed at an upper portion of one of the microcavities is different from that of the liquid crystal material disposed at a lower portion of the same one of the microcavities.

3. The liquid crystal display of claim 2, wherein a pretilt angle difference between the liquid crystal materials disposed at the upper portion and the lower portion of the microcavities increases from the central portion to the peripheral portion.

4. The liquid crystal display of claim 3, wherein the roof layer has a curved bottom surface that interfaces the microcavities and a flat top surface that is parallel with the substrate.

5. The liquid crystal display of claim 3 wherein the substrate is bent,
wherein a bottom surface of the roof layer is parallel with the substrate and a top surface of the roof layer has a curvature.

6. The liquid crystal display of claim 4 wherein, at one of the microcavities in the peripheral portion, the liquid crystal material that is adjacent to the substrate is substantially vertically aligned to the substrate and the liquid crystal material that is adjacent to the roof layer has a tilt angle.

7. The liquid crystal display of claim 3 wherein the substrate is bent,
wherein the liquid crystal material that is adjacent to the roof layer is substantially vertically aligned and the liquid crystal material that is adjacent to the substrate has a tilt angle in the microcavities disposed at the peripheral portion.

8. The liquid crystal display of claim 1, wherein a difference between a maximum thickness and a minimum thickness of the roof layer increases with distance from the central portion of the substrate.

9. The liquid crystal display of claim 1 wherein the substrate is bent, wherein a thickness of the roof layer is constant across the substrate.

10. The liquid crystal display of claim 1, wherein a forward direction from the central portion to the peripheral portion is substantially parallel with long sides of the substrate.

11. The liquid crystal display of claim 10, wherein cell gaps of the microcavities disposed in the central portion of the substrate are substantially constant.

12. The liquid crystal display of claim 1, wherein a tilt angle of the liquid crystal material that is adjacent to the roof layer at the microcavities increases with distance from the central portion of the substrate.

13. A manufacturing method of a liquid crystal display, the method comprising:
   forming a thin film transistor on a substrate;
   forming a pixel electrode to be connected to the thin film transistor;
   forming sacrificial layer patterns on the pixel electrode;
   forming a roof layer on the sacrificial layer patterns;
   forming a plurality of microcavities by removing the sacrificial layer patterns;
   forming a liquid crystal layer by injecting a liquid crystal material into the microcavities; and
   forming a capping layer on the roof layer,
   wherein, in the forming of the sacrificial layer patterns, a difference between a maximum height and a minimum height of each of a plurality of sacrificial layer patterns increases with distance from a central portion of the substrate.

14. The manufacturing method of claim 13, further comprising using a slit mask to form the sacrificial layer patterns.

15. The manufacturing method of claim 14, wherein the roof layer has a curved bottom surface interfacing the microcavities and a flat top surface that is parallel with the substrate.

16. The manufacturing method of claim 15, further comprising bending the substrate such that
   the bottom surface of the roof layer is parallel with the substrate and the top surface has a curvature.

17. The manufacturing method of claim 13, wherein a difference between a maximum thickness and a minimum thickness of the roof layer increases with distance from the central portion of the substrate.

18. The manufacturing method of claim 17, further comprising
   bending the substrate such that a thickness of the roof layer is constant.

19. The manufacturing method of claim 13, wherein a forward direction from the central portion to the peripheral portion is parallel with long sides of the substrate.

20. The manufacturing method of claim 19, wherein cell gaps of the microcavities disposed at the central portion of the substrate are substantially constant.

* * * * *